United States Patent
Rogers et al.

(10) Patent No.: US 7,521,947 B2
(45) Date of Patent: Apr. 21, 2009

(54) PROBE NEEDLE PROTECTION METHOD FOR HIGH CURRENT PROBE TESTING OF POWER DEVICES

(75) Inventors: Gary Rogers, Mesa, AZ (US); Steve Clauter, Tempe, AZ (US); Rodney Schwartz, Tiki Island, TX (US); Taichi Ukai, Tokyo (JP); Joe Lambright, Gilbert, AZ (US); Dave Lohr, Chandler, AZ (US)

(73) Assignee: Integrated Technology Corporation, Tempe, AZ (US)

( * ) Notice: Subject to any disclaimer, the term of this patent is extended or adjusted under 35 U.S.C. 154(b) by 0 days.

(21) Appl. No.: 11/752,526

(22) Filed: May 23, 2007

(65) Prior Publication Data

US 2008/0290882 A1 Nov. 27, 2008

Related U.S. Application Data

(60) Provisional application No. 60/747,981, filed on May 23, 2006.

(51) Int. Cl.
*G01R 31/02* (2006.01)
*G01R 31/26* (2006.01)
*G01R 1/00* (2006.01)

(52) U.S. Cl. .............. 324/754; 324/110; 324/757; 324/765

(58) Field of Classification Search ............ 324/754, 324/765, 110, 757
See application file for complete search history.

(56) References Cited

U.S. PATENT DOCUMENTS

| | | | |
|---|---|---|---|
| 4,464,623 A * | 8/1984 | Chambon | 324/72.5 |
| 5,070,297 A * | 12/1991 | Kwon et al. | 324/754 |
| 5,365,180 A | 11/1994 | Edelman | |
| 5,455,502 A | 10/1995 | Kato et al. | |
| 6,069,484 A * | 5/2000 | Sobolewski et al. | 324/765 |
| 6,215,324 B1 * | 4/2001 | Yoshida | 324/760 |
| 7,029,932 B1 | 4/2006 | Hiser et al. | |
| 7,078,927 B2 * | 7/2006 | Tanida et al. | 324/765 |
| 7,295,021 B2 * | 11/2007 | Gaggl | 324/754 |
| 7,375,539 B2 * | 5/2008 | Mori | 324/758 |
| 2002/0003432 A1 | 1/2002 | Leas et al. | |
| 2003/0234659 A1* | 12/2003 | Zieleman | 324/765 |
| 2005/0225341 A1* | 10/2005 | Byrd | 324/754 |
| 2005/0237073 A1 | 10/2005 | Miller et al. | |
| 2006/0028221 A1 | 2/2006 | Hasegawa | |
| 2006/0091898 A1 | 5/2006 | Gaggl | |

FOREIGN PATENT DOCUMENTS

DE 103 08 333 9/2004

\* cited by examiner

*Primary Examiner*—Ha Tran T Nguyen
*Assistant Examiner*—Karen M Kusumakar
(74) *Attorney, Agent, or Firm*—Renner, Otto, Boisselle & Sklar, LLP

(57) ABSTRACT

A test system, apparatus and method for applying high current test stimuli to a semiconductor device in wafer or chip form includes a plurality of probes for electrically coupling to respective contact points on the semiconductor device, a plurality of current limiters electrically coupled to respective ones of the plurality of probes, and a current sensor electrically coupled to the plurality of probes. The current limiters are operative to limit current flow passing through a respective probe, and the current sensor is operative to provide a signal when detected current in any contact of the plurality of probes exceeds a threshold level.

24 Claims, 15 Drawing Sheets

PROBE NEEDLE PROTECTION METHOD FOR HIGH CURRENT PROBE TESTING OF POWER DEVICES

RELATED APPLICATION DATA

This application claims the benefit of U.S. Provisional Application No. 60/747,981 filed on May 23, 2006, which is incorporated herein by reference in its entirety.

TECHNICAL FIELD OF THE INVENTION

The present invention relates generally to the testing of semiconductor chips, such as power semiconductor chips and more particularly, to a method and apparatus for testing power semiconductor chips in wafer or chip form by making reliable contact to the chip via probing needles.

BACKGROUND OF THE INVENTION

Power semiconductor devices are fabricated by a series of batch processes in which wafers, typically of silicon or other compatible material, are processed to produce a particular type of power semiconductor chip. Each wafer contains a plurality of power semiconductor die or chips, typically of the same kind. As is known, chemical, thermal, photolithographic and mechanical operations are typically involved in the fabrication of the power semiconductor wafer. Because of variations across the wafer and across each individual chip caused by process variables or physical phenomena, however, not all chips on the wafer will meet the desired specifications for the chips. Some method of testing is employed to determine which chips alone or on any given wafer meet the specifications. Since the power semiconductors are designed to handle high currents and voltages, it is desirable to test the chip at its rated conditions. This is very difficult and presents several unique problems when performing the tests on the wafer or the chip before it is assembled into a package designed to handle the high power levels.

Power semiconductor chips are typically fabricated with one or more layers of metal interconnect on the surface of the chip which provide connecting paths to form the desired circuit. The metal interconnect layer or layers also provide a means to make connections to the power semiconductor chip when the chip is separated from the wafer and is assembled into a package or carrier. Interconnect points, typically called "bonding pads", are formed by the metal interconnect and are arranged on the surface of the chip so as to allow bonding wires or other connecting means to be connected from the power semiconductor chip to its carrier or package. These same bonding pads, and others designed specifically for test purposes, can be used to make electrical contact to each individual chip for testing the electrical characteristics of the chips even while still joined together in wafer form or in chip form after separation from the wafer.

The yield of good chips on a wafer is defined as the percentage of good dies with respect to the total dies present on the wafer. Yield is the single most important cost factor in the production of power semiconductor devices. Each process and test step may be considered a potential yield loss point. The testing of each die on the wafer may result in yield loss not only from the manufacturing processes, but also from problems which can occur due to errors in testing operations. For example, during a probe testing operation, electrical contact is made to the bonding pads of each power semiconductor in order to electrically stimulate the circuit and to measure critical parameters. An array of fine wire probes, conductive bumps and/or fine beams formed on a card is/are aligned so as to correspond with the array of bonding pads and is/are used to mechanically and electrically contact the array of bonding pads. Typically, each die on the wafer is sequentially positioned and aligned under the array of probes, for example, and the wafer is moved up to allow contact of the respective probes onto the chip. Precision wafer movement stages allow each chip to be positioned under the probe array, brought into contact with the probe array, and tested. The chips on the wafer which do not pass the electrical test are marked by some method such as by applying a dot of ink or by storing their respective position on the wafer in computer memory for later recall.

In most cases, the interconnecting metal layer or layers of the power semiconductor chip are formed of aluminum or sometimes gold. These metals provide good processing characteristics and good electrical characteristics. However, these metals are also rather soft in comparison with the typical materials used for forming the probes on the card (referred to herein as a power semiconductor probe card). As a result, it is likely that damage to the bonding pad area or the probe card itself will occur if the probe card is not properly constructed, aligned, adjusted and/or utilized. For example, the tips of the probes are carefully adjusted for planarity to insure that all probes touch the respective bonding pads at relatively the same time. The probes also are adjusted to contact, e.g., touch down, accurately on each pad. After the probes initially contact the respective bonding pads, a proper amount of overdrive is maintained past the point of initial contact in order to provide a contacting force resulting in a consistent low resistance contact.

The tips of the probes themselves should be capable of providing low resistance contact between the probe and the bonding pads and should be free of contaminants that prevent good electrical contact. The contacting force or spring constant of the probe itself is also a parameter which should be considered in determining the ability of a probe to provide a proper contact. If a probe does not make good contact, attempting to pass high current to die will result in excessive heating at the contact point. This can very easily burn the tip of the probe causing further increase in resistance and further damage to the probe and possibly to the power semiconductor chip.

Various technologies have been used to produce probe cards for testing power semiconductors. The most common types are blade, epoxy ring and membrane technologies. A fourth type, which involves what is referred to a "buckling beam", also has been used by some manufacturers. Blade technology is discussed in U.S. Pat. No. 4,161,692 for a "Probe Device for Power semiconductor Wafers"; U.S. Pat. No. 3,849,728 for a "Fixed Point Probe Card and an Assembly and Repair Fixture Therefor"; and U.S. Pat. No. 4,382,228 for a "Probes for Fixed Point Probe Cards". Epoxy ring technology is discussed in U.S. Pat. No. 3,835,381 for a "Probe Card Including a Multiplicity of Probe Contacts and Methods of Making"; U.S. Pat. No. 3,905,008 for a "Microelectronic Test Probe Card Including a Multiplicity of Probe Contacts and Method of Making Same"; U.S. Pat. No. 4,599,559 for "Test Probe Assembly for IC Chips"; and U.S. Pat. No. 4,757,256 for a "High Density Probe Card". Buckling beam technology is discussed in U.S. Pat. No. 4,554,506 for a "Modular Test Probe"; and U.S. Pat. No. 4,843,315 for a "Contact Probe Arrangement for Electrically Connecting a Test System to the Contact Pads of a Device to be Tested".

The most commonly used type of technology to produce power semiconductor probe cards is epoxy ring technology, although the other technologies are similar. In the construction of an epoxy ring type probe card, a sheet of Mylar is punched or drilled with a series of holes in the same array pattern as the bonding pad locations on the chip. The holes are sized to accept the tip of each probe and hold the tip in position during construction of the card. These holes are typically 0.003 inch to 0.005 inch in diameter. Each probe is made from a length of spring wire which is tapered to a point at one end and bent down at a steep angle to form a probe tip. Each probe tip is placed in a corresponding hole in the Mylar sheet. The other end of each spring wire probe is arrayed in a generally circular pattern with those of the other probes and is secured in place by a ring of epoxy or another suitable material. The ends protrude through the epoxy in order to be soldered to a circuit board which forms the probe card. After the probes are soldered to the circuit board, the probe tips are sanded to provide relatively flat probe tips positioned in a relatively planar array.

Contact resistance of the probe tips can be measured using conventional techniques for the measurement of low resistances. A typical method would be to bring the probe tip into contact with a conducting metal surface and measure the resistance of the resulting interface. The type of metal used for the contact plate is typically gold, nickel or Rhodium and some differences will be observed between the resistance measured by these conventional methods and the actual resistance observed when the probe is contacting bonding pads formed using aluminum metallization, for example, on the power semiconductor chip.

Furthermore, since the aluminum is rather soft in comparison with the probe tip material, the tip of the probe will tend to protrude or "dig" into the aluminum and make contact over a much larger surface area of the tip as compared to on the harder gold surface. The angle of the probe tip relative to the bonding pad is such that a scrubbing motion is created when the tip is driven against the pad. In the case of a bonding pad made of soft aluminum, this creates a scrub mark corresponding to the path of the probe tip on the pad. The material used for the probe tip is critical to insure a low contact resistance between the probe tip and the pad. The typical material used for power semiconductor probing is beryllium copper although some probe cards use standard tungsten probes for lower cost.

Since a single probe can handle only a limited amount of current, multiple probe connections are typically made to each pad of the power semiconductor chip. It is standard practice to use more probes on a pad than would typically be required to carry the desired current since it is known that some probes will have a higher resistance and not be able to carry their share of the load. There is a trade-off between how many probes can be feasibly and economically placed on each pad and desired redundancy of the connection. The typical problem with this technique is that there is no indication of a contact problem in the test other than a loss of yield because the chip does not meet its specifications. Without some other indicator, the tester cannot determine whether it is the chip or the probe card which is causing the problem. Testing may proceed for some time before it can be determined that the probe contact is bad and the probe card should be serviced or replaced. Since the cost of the tester, wafer prober, facility, etc., is very high, this can be very costly and should be avoided if possible. Also, continuing to pass current though probes with high contact resistance will very likely burn the probe tips and may damage the aluminum pads by creating defects in the pad metallization.

The same conditions exist on integrated circuit chips which require high levels of supply and ground currents such as a high performance microprocessor. These chips are normally constructed with multiple supply and ground pads to share the current. As in power semiconductor chips, if some of the probe tips lose contact with their respective pads, the remaining probe tips share the total current and operate at a higher level. At some point this current level may become too high and exceed the specified probe tip current carrying capacity.

A second problem is that the best probes, i.e., those with the lowest resistance will tend to have the highest current. This may over stress these "good probes" and cause them to fail thus compounding the problem. It is desirable to insure that the current is shared relatively equally among the probes and does not exceed the specified maximum for any single probe. The standard method of merely paralleling multiple probes on a given pad of a power semiconductor chip or on the multiple pads of an integrated circuit chip does not accomplish this goal since the contact resistance of the probe tips to the pad can vary widely.

SUMMARY OF THE INVENTION

A method and system are provided to allow high current testing of power semiconductor chips or integrated circuit chips in wafer or chip form while limiting the maximum current of each individual probe to a safe value. Further, a method and system are provided for sensing when the contacts to the power semiconductor chip or integrated circuit chip under test are not adequate for the current levels and removing the power from the probes before the chip or the probe card is damaged. Additionally, a method and system are provided to sense the contact resistance of each probe during its use and predict potential problems before they occur so maintenance can be scheduled before catastrophic failure of the probe card.

According to one aspect of the invention, a test apparatus for applying high current test stimuli to a semiconductor device in wafer or chip form, said semiconductor device including a plurality of contact points includes: a plurality of probes for electrically coupling to respective ones of the plurality of contact points on the semiconductor device; a plurality of current limiters electrically coupled to respective ones of the plurality of probes, said current limiters operative to limit current flow in a corresponding probe; and a current sensor electrically coupled to each of the plurality of probes, said current sensor operative to provide a signal when detected current in any probe exceeds a predetermined level.

According to one aspect of the invention, the test apparatus includes an inhibit circuit operatively coupled to the current sensor, wherein when the current sensor generates the signal, the inhibit circuit prevents current flow through each of the probes.

According to one aspect of the invention, the semiconductor device is at least one of an integrated circuit or a power semiconductor.

According to one aspect of the invention, the current limiters comprise a power transistor in combination with control circuitry, the control circuitry operative to limit the current flow through the power transistor.

According to one aspect of the invention, the power transistor is a power metal oxide semiconductor field effect transistor (MOSFET) or an insulated gate bi-polar transistor (IGBT).

According to one aspect of the invention, the current sensor comprises a current limit sensing circuit operative to detect when any one of the current limiters transition into a constant current mode.

According to one aspect of the invention, the test apparatus includes a silicon controlled rectifier (SCR) device coupled between an emitter/source terminal and a collector/drain terminal of the semiconductor device, wherein the current sensor comprises a current limit sensing circuit that drives the SCR device so as to shunt current away from the emitter/source and collector/drain of the semiconductor device.

According to one aspect of the invention, the test apparatus includes a verification device operative to determine if a resistance between a probe/contact interface defined between a probe and a corresponding contact point is within predetermined limits.

According to one aspect of the invention, the verification device includes measurement circuitry to sense a voltage drop across each individual probe/contact interface.

According to one aspect of the invention, the measurement circuitry is operative to inject a measurement current through each probe and to sense a resulting voltage drop across the probe/contact interface.

According to one aspect of the invention, each of the plurality of current limiters is operative to be enabled or disabled independent of other ones of the plurality of current limiters.

According to one aspect of the invention, the current limiters are configured as open loop controllers.

According to one aspect of the invention, a method for applying high current test stimuli to a semiconductor device in wafer or chip form, said semiconductor device including a plurality of contact points, the method including: coupling a plurality of probes to respective ones of the plurality of contact points on the semiconductor device; and independently limiting current flow through each probe of the plurality of probes to a predetermined level.

According to one aspect of the invention, the method includes inhibiting current flow through the probes upon detection of a fault condition.

According to one aspect of the invention, the method includes determining if a resistance between a contact interface defined between a probe and a corresponding contact point is within predetermined limits.

According to one aspect of the invention, determining the resistance includes measuring a voltage drop across each individual contact interface.

According to one aspect of the invention, measuring a voltage drop includes injecting a measurement current through each probe and measuring the resulting voltage drop across the contact interface.

According to one aspect of the invention, independently limiting current includes using an open loop controller to limit the current.

According to one aspect of the invention, the method includes generating a signal when the current flow in any probe of the plurality of probes exceeds the predetermined level.

According to one aspect of the invention, the method includes inhibiting current flow through the plurality of probes upon generation of the signal.

According to one aspect of the invention, a method of measuring a contact resistance between a plurality of probes of a test apparatus and a plurality of contact points on a semiconductor device in wafer or chip form, wherein each of the plurality of contact points correspond to a first junction or a second junction of the semiconductor device, said test apparatus further including a plurality of current limiters electrically coupled to respective ones of the plurality of probes, the method including: enabling each of the plurality of current limiters coupled to the first and second junctions; injecting a known current through the first junction and the second junction via the plurality of probes; measuring a first voltage between the first junction and the second junction while the semiconductor device is enabled; disabling all but one of the current limiters coupled to one of the first junction or the second junction while leaving all of the current limiters coupled to the other of the first junction or the second junction enabled; measuring a second voltage between the first junction and the second junction while the semiconductor device is enabled; and determining the contact resistance based on the known current and the difference between the first voltage and the second voltage.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, are of but a few of the various ways in which the principles of the invention may be employed. Other objects, advantages and novel features of the invention will become apparent from the following detailed description of the invention when considered in conjunction with the drawings.

DETAILED DESCRIPTION OF THE PREFERRED EMBODIMENTS

Figure 1:
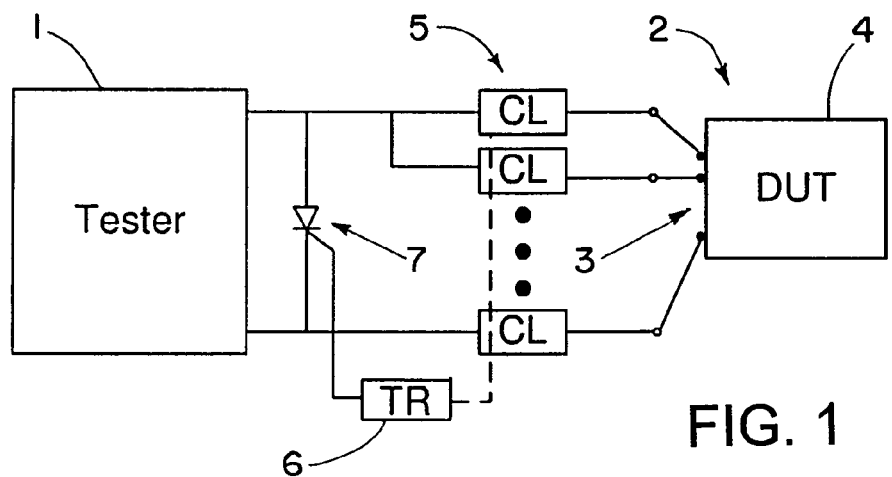
FIG. 1 is a simple block diagram of an exemplary system for testing semiconductor devices in accordance with the invention.

The present invention will now be described with reference to the drawings, wherein like reference numerals are used to refer to like elements throughout.

Referring initially to FIG. 1, a test apparatus 1 is shown for testing semiconductor devices while in chip or wafer form. The test apparatus 1 includes a plurality of probes 2 for contacting bonding pads 3 of a device under test 4 (DUT), e.g., a semiconductor device. A test current may be injected into the DUT 4 via the probes 2 and bonding pads 3 so as to evaluate whether or not the DUT meets certain criteria. Each probe circuit includes a current limiter 5 that is operative to limit an amount of current flowing through the respective probe 2, independent of the current flowing through other probes. By limiting current flow through the probes, damage to the probes, DUT and/or the test apparatus itself may be prevented.

Further, a trigger circuit 6 can monitor each current limiter 5 and, upon detecting certain predefined conditions, the trigger circuit 6 may enable SCR 7, which diverts current away from the DUT 4, thereby preventing or minimizing damage to the DUT 4 and/or probes 2.

In addition, the test apparatus 1 may be used to implement a method for determining if a contact resistance between the probes 2 and bonding pads 3 is within a satisfactory range. This enables possible failing probes to be detected prior to performing test operations, thereby minimizing the likelihood of inaccurate test results.

Operation of the current limiters 5 as well as methods of using the system to perform pre-test measurements of contact resistance will be described in more detail below.

Figure 2:
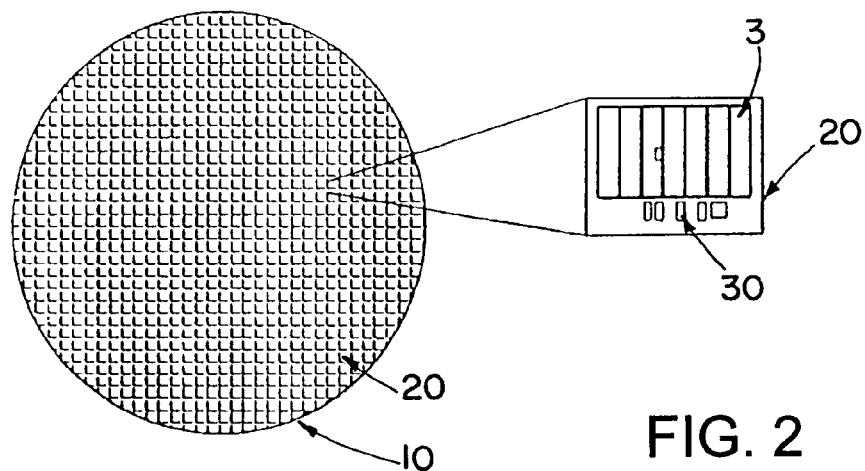
FIG. 2 is a schematic diagram of an exemplary power semiconductor wafer including an exploded view of a power semiconductor chip on the wafer showing the bonding pad areas.

Referring now to FIG. 2, a top view of an exemplary power semiconductor wafer 10 is shown including a plurality of power semiconductor chips 20. An enlarged view of one of the chips 20 is provided so as to illustrate a plurality of bonding pads 3. It is noted that although a power semiconductor chip is discussed herein, the device and method described herein also may be applied to other semiconductor devices, including integrated circuits.

Figure 3:
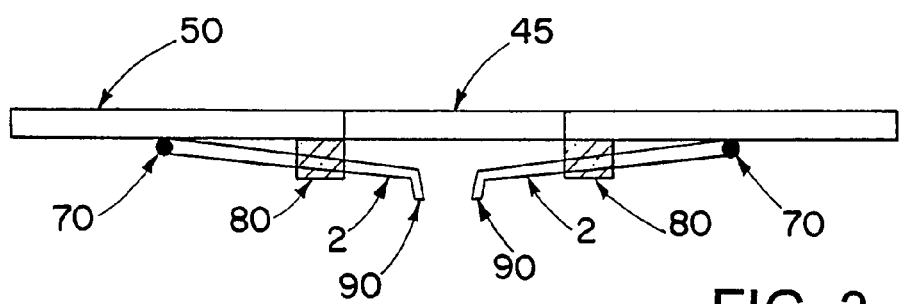
FIG. 3 is a cross-sectional view of an exemplary power semiconductor probe card.

In order to determine which chips 20 on the wafer 10 meet the desired specifications, electrical tests are performed on each chip 20 using an exemplary power semiconductor probe card (FIG. 3). Electrical contact to the respective chips 20 is made via the respective bonding pads 3. These bonding pads 3 can serve the dual purpose of providing connection points for bonding wires (not shown) which provide conducting paths from the chip 20 to its package or carrier, and providing contact points for probes to provide connection to a suitable probe card for electrically testing the chips 20 on the wafer 10.

A side view of an exemplary probe card 45 for testing power semiconductor chips 20 in wafer form is shown in FIG. 3. The probe card 45 includes a printed circuit board 50 to which are attached a plurality of fine wire probes 2. These probes 2 are typically attached to traces on the printed circuit board 50 by solder connections 70. The tips of the probes 2 are designated 90 and are arrayed in a pattern to match the bonding pad configuration of the chip 20 to be tested. The probes 2 are held in their particular configuration by an epoxy or ceramic ring 80 as described herein. The fine wire probes 2 are typically formed of tungsten, beryllium, copper or another suitable metal. The tips 90 of the probes 2 are typically from 0.003 inch to 0.005 inch in diameter. The tips 90 are carefully positioned to contact the bonding pads 3 (FIG. 2) in such a way as to provide reliable contact to the respective pads 3. The configuration of the probes 2 is such that as the probe tips 90 are pressed against the bonding pads 3, some lateral motion of the tip across the pad 3 called "scrubbing" occurs. If all of the probe tips 90 were in exactly the same horizontal plane parallel to the printed circuit board 50, this scrubbing contact action on the pads 3 would be very predictable and repeatable. Because of the physical processes required to construct the probe card 45, however, the probe tips 90 will not be perfectly planar with respect to the surface of the printed circuit board 50 or the surface of the chip 20 on which the bonding pads are located. If the probe tips 90 are sufficiently out of planarization (i.e., out of a planar state), the scrubbing action of the lower positioned probe tips 90 may cause those probe tips 90 to travel off of the respective pads 3 before the higher positioned probe tips 90 make contact with the pads 3. Similarly, the probe tips 90 will not be perfectly aligned to make contact in exactly the same spot on all pads 3. Misalignment of the probe tips 90 with the pads can cause the tip to miss the pad 3 and/or possibly damage the protective oxide layer which surrounds the pad 3. Probe tips 90 which are sufficiently out of planarity may not create the force required on the pads 3 to make a good low resistance contact.

In order to provide a sufficiently low current path for testing the chip 20, multiple probe tips 90 are positioned so as to contact the pads 3. Space considerations and voltage isolation considerations will limit the number of probe tips 90 and the space between the probes 2. Tradeoffs are made between a larger number of probes 2 which is desirable for low contact resistance and difficulty of manufacture because of the tighter spacing between the probes 2. Tighter spacing between probes 2 that have high voltage between them can also be a problem since a minimum spacing should be maintained to prevent arcing between the probes 2. An exemplary configuration of probes 2 contacting a power semiconductor chip 20 is shown in FIG. 4.

Figure 4:
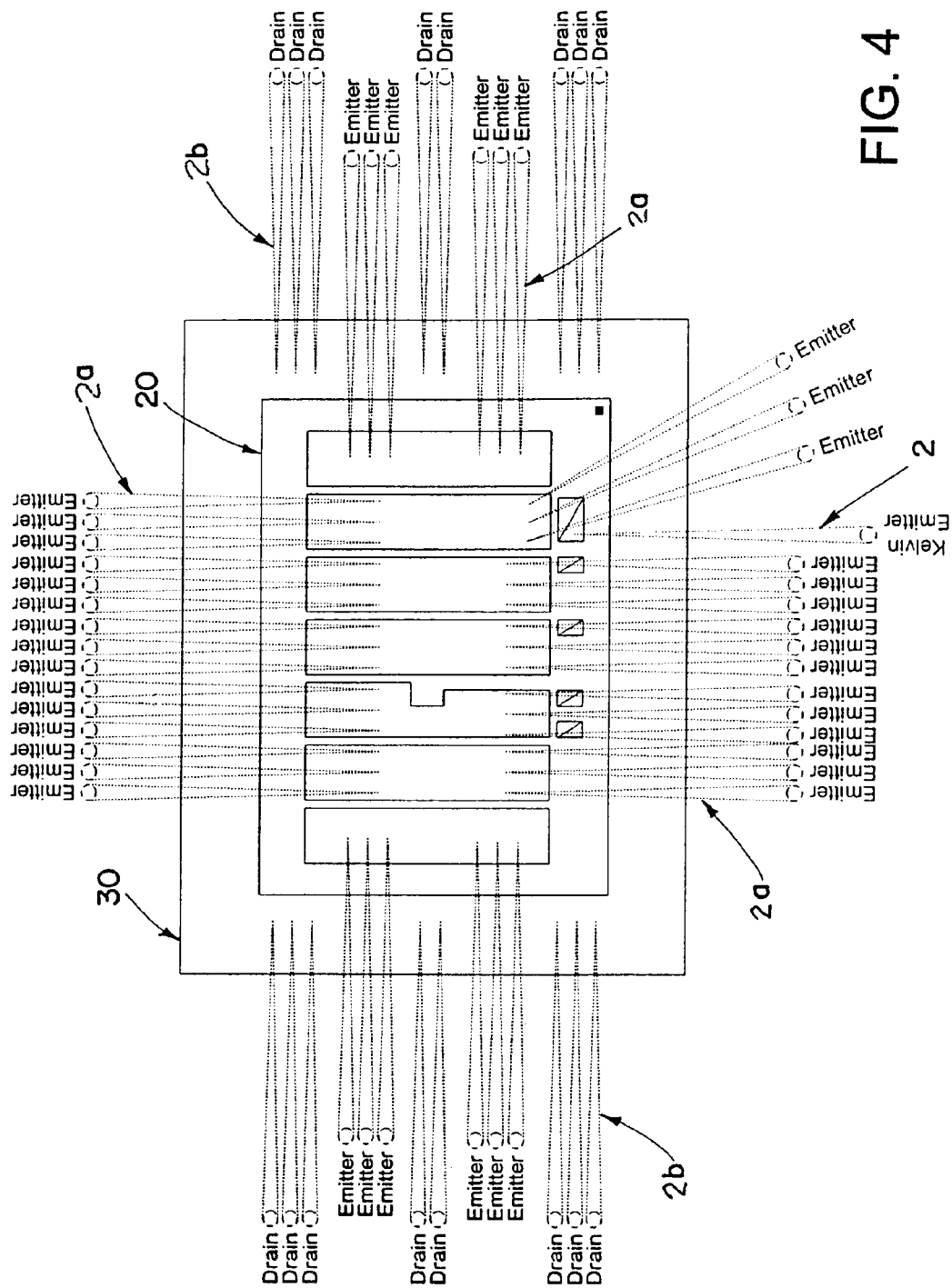
FIG. 4 is a top view of an exemplary power semiconductor chip with probes contacting it for test.

FIG. 4 shows an exemplary power semiconductor chip 20 which is typical of a power MOSFET or IGBT. The large pads 3 are the source connections for a power MOSFET or the emitter connections for an IGBT device. The drain connection for a power MOSFET or the collector connection for an IGBT device would be the back of the power semiconductor chip 20. The connection to drain or collector in FIG. 4 is represented by the test contact area 30 which represents a typical wafer prober chuck or a metal holding plate for a single power semiconductor chip 20. Multiple probes 2a contact each source/emitter pad 3. Multiple probes 2b contact the test contact area 30 which is in contact with the back of the power semiconductor chip 20 for the connection to the drain/collector. The number of probes 2 is chosen such that some of the probes 2 may fail to make contact with the pads 3 or the test contact area 30 and still not exceed the aggregate current limit of the remaining probes. As each failing or non-contacting probe 2 is removed from the current path, the remaining probes 2 carry additional current. Since the contact resistance of the probe tips 90 is variable, some probes 2 will carry more current than others. At some point as more and more failing probes 2 are removed from the path, the remaining probe tip 90 with the lowest contact resistance will reach its maximum specified current. Increasing the current through this probe 2 is likely to damage it and possibly damage the power semiconductor chip 20 as well.

A single probe 2 is shown contacting the gate of the power semiconductor chip 20. Since there is no high current requirement for the gate connection, a single probe is sufficient although multiple probes 2 could be used for Kelvin connection or more reliable contact.

Figure 5:
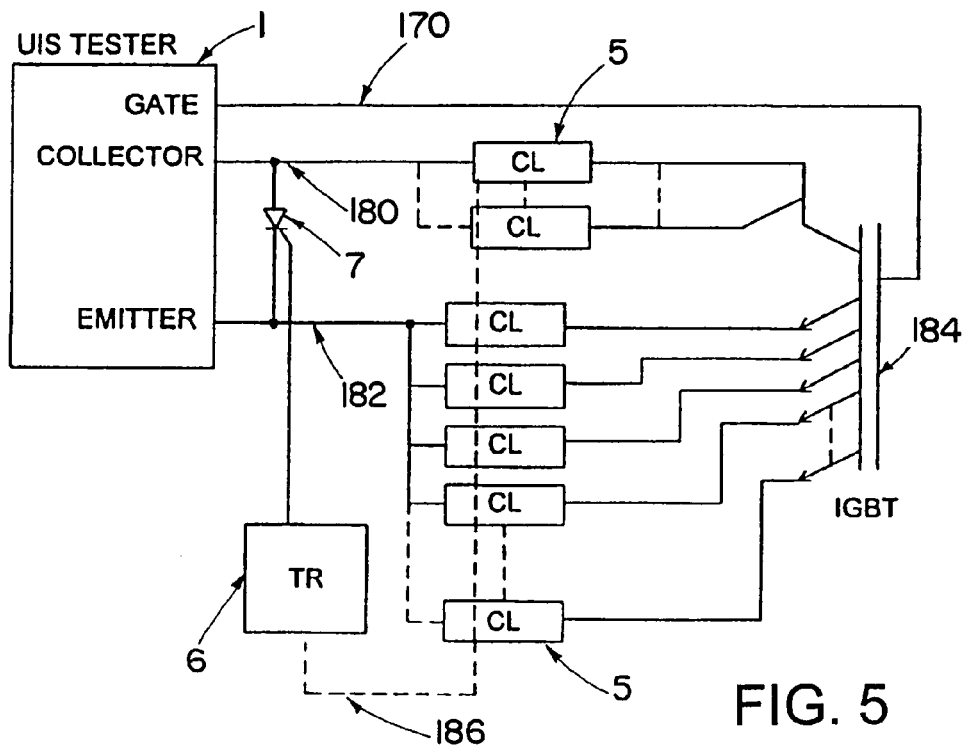
FIG. 5 is a schematic diagram of an exemplary Unclamped Inductive Switching (UIS) test including current limiting probe protection and control in accordance with the invention.

In order to prevent damage to the probe tips 90, the maximum current is limited in each probe 2. If any one probe 2 attempts to conduct more than its maximum rated current, testing may be terminated and the current diverted from the probe 2. An exemplary block diagram of a system to accomplish this is shown in FIG. 5. A test system 1 is shown connected to the gate 170, collector 180 and emitter 182 of an IGBT transistor 184. For illustration purposes, the test described will be UIS (Unclamped Inductive Switching), however, the principles are the same for any type of high current test performed on the IGBT transistor 184. Each high current connection through a probe tip 90 for the collector 180 or the emitter 182 of the IGBT 184 is limited to a defined maximum current by a current limiter 5. Since the current levels required for the test are much higher than a single probe tip 90 can carry, multiple connections are made to the collector 180 and emitter 182.

Each individual probe tip 90 connection includes a separate current limiter 5 to insure it never passes more than a specified maximum current. During the test when current is applied, each path through a probe tip 90 will have a different path resistance due to contact resistance of the probe tip 90, wiring resistance, etc. This will cause certain probe tips 90 with the lowest resistance to pass more current than others. If the path resistance of some probe tips 90 becomes very high, they effectively lose contact and are not part of the current path. This causes the other probe tips 90 to pass more current since the total current is divided into the available parallel paths. If conditions cause a probe tip 90 to try to pass more than the maximum specified current, the current limiter 5 enters a current source mode to limit the current to no more than the specified value. At this point, the test may no longer be valid and should be terminated. Preferably, the test is terminated in a way which will protect the IGBT 184 under test, the probe tips and tester 1 from damage by the high currents and voltages. One way to accomplish this is to generate a signal 186 from the current limiter 5 when its programmed maximum current is reached. This signal 186 can then be used to turn on a parallel current path, in this case an SCR 7, through a trigger circuit 6 which passes the test current away from the IGBT 184. This effectively removes all high currents from and prevents damage to the probe tips 90.

Figure 6:
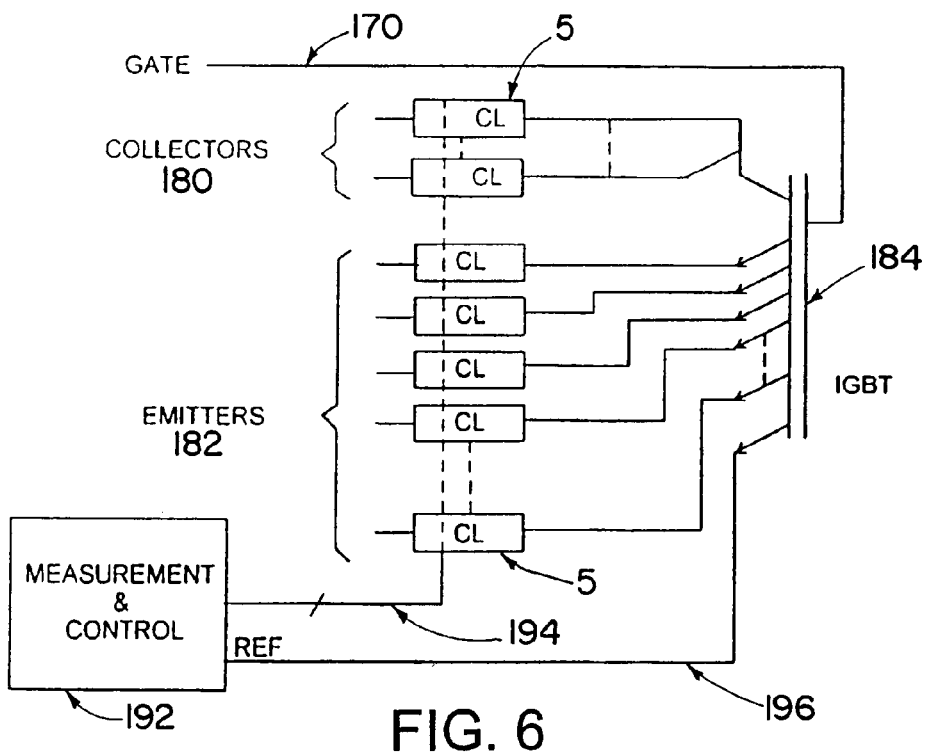
FIG. 6 is a schematic diagram for performing an exemplary pretest measurement of probe tips contact resistance prior to applying high test current in accordance with the invention.

Another method to prevent damage to the probe tips 90 is to determine by a pretest measurement that each probe tip 90 does not have excessive contact resistance before applying the high value of test current. This can be used in combination with all methods described above. Referring to FIG. 6, the measurement and control circuit 192 provides the means to measure the voltage drop of each individual collector 180 and emitter 182 probe contact via the measurement lines 194. An emitter Kelvin measurement point 196 may be used to reference the measurement. Measurement of contact resistance is described in more detail below with respect to FIG. 18.

Figure 7:
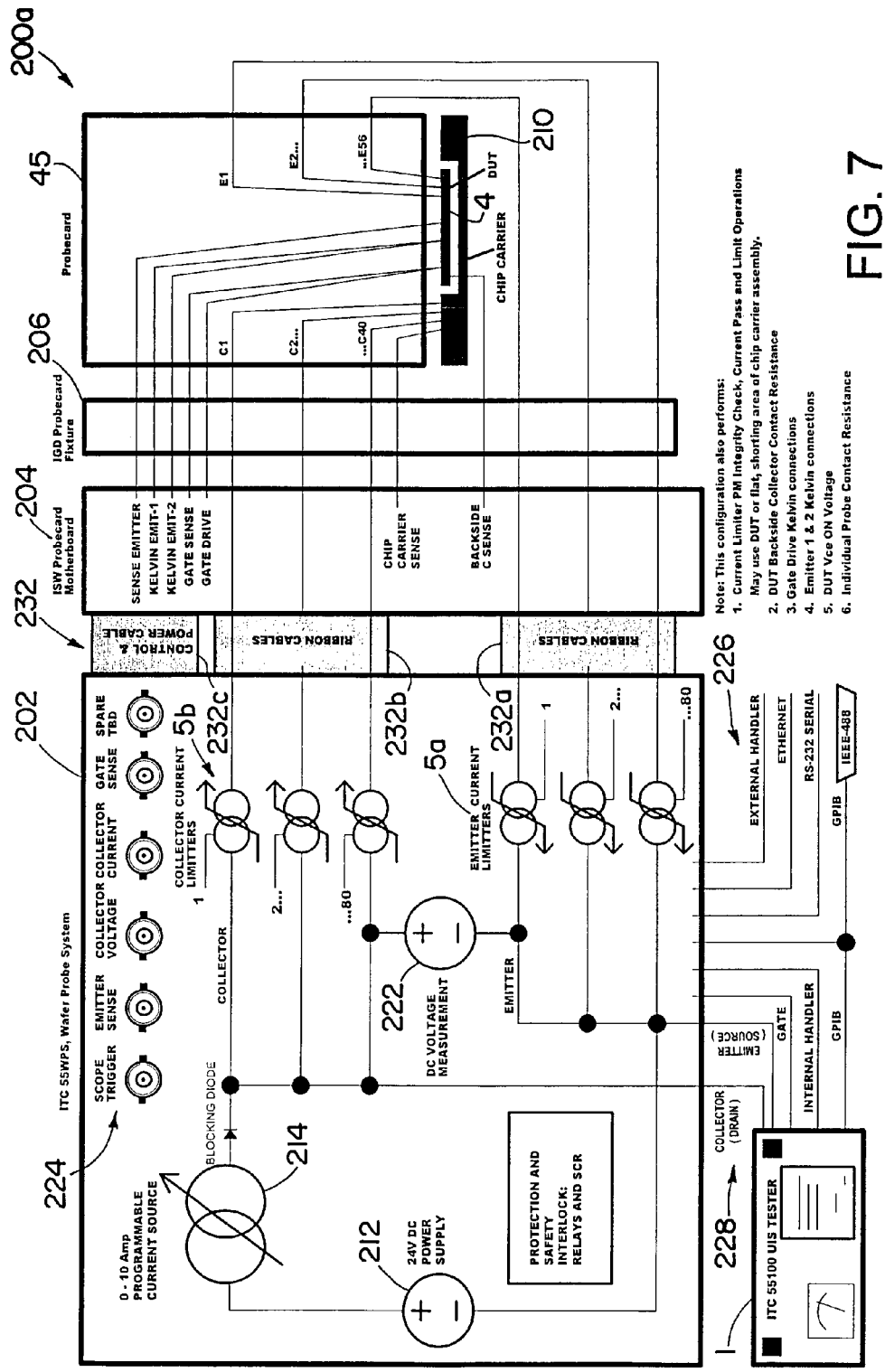
FIG. 7 is a schematic diagram of an exemplary system for performing inductive switching tests on semiconductor devices, wherein the system includes current limiting in accordance with the invention.
Figure 8:
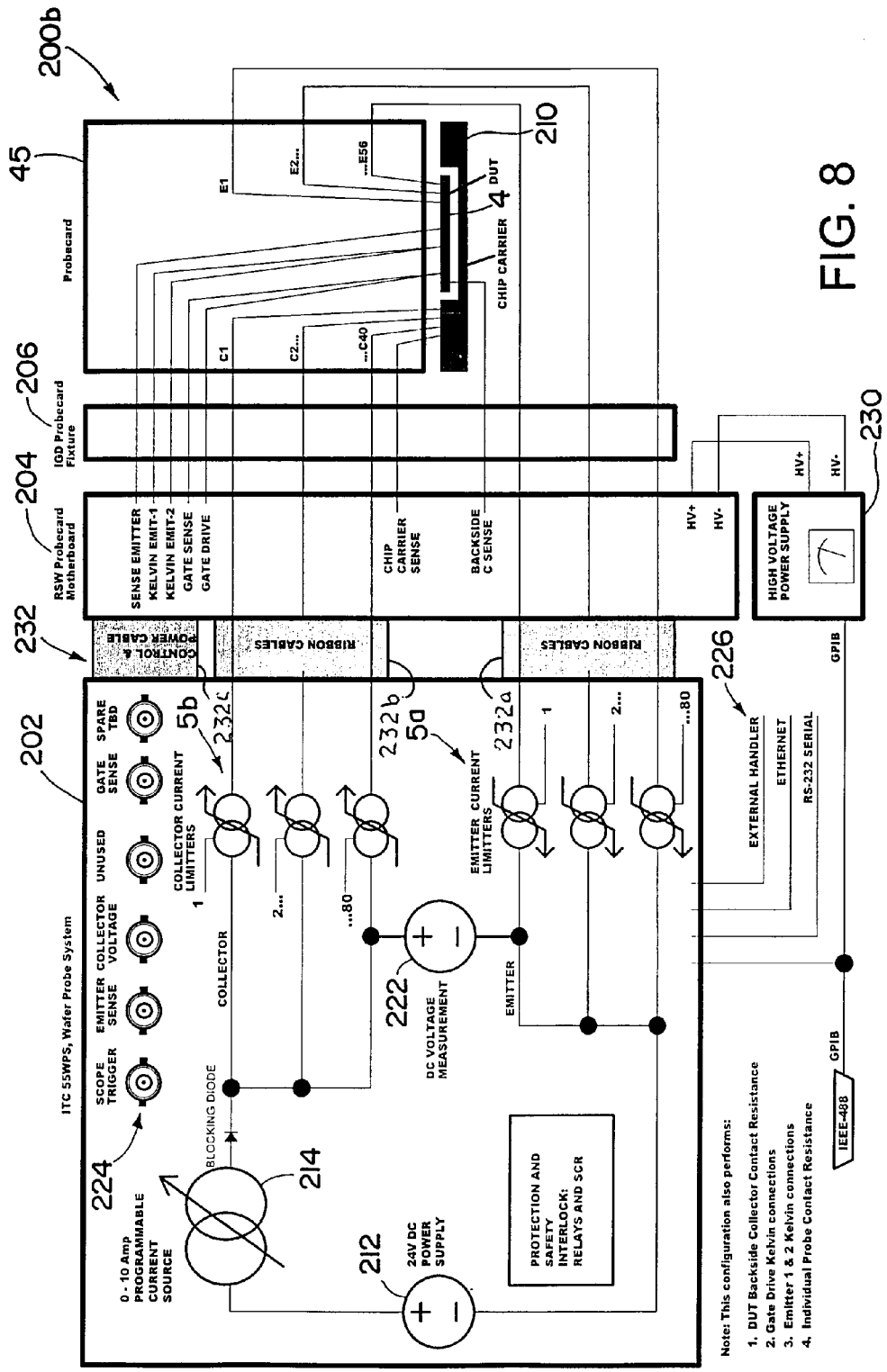
FIG. 8 is a schematic diagram of an exemplary system for performing resistive switching tests on semiconductor devices, wherein the system includes contact resistance measurement in accordance with the invention.

Moving now to FIGS. 7 and 8, exemplary systems for testing semiconductor devices are shown. More specifically, FIG. 7 illustrates an exemplary test system 200*a* configured for avalanche and inductive switching (ISW) tests, while FIG. 8 illustrates an exemplary test system 200*b* configured for resistive switching (RSW) tests. Each system 200*a* and 200*b* includes a wafer probe system 202, a probe card motherboard 204, an IGD probe card fixture 206, a probe card 45, and a chip carrier 210. As will be described below, the respective configurations (i.e., ISW or RSW) may be implemented via the probe card motherboard 204, although other implementations are possible. The wafer probe system 202, motherboard 204, probe card 45 and carrier 210 are electrically coupled to one another via electrical conductors (e.g., ribbon cables, a bus interface, etc.) so as to enable control signals and data signals to be exchanged therebetween.

Power may be provided to the test system 200*a* and 200*b* via the wafer probe system 202, which includes a DC power source 212 (e.g., a 24 VDC source or the like) and a programmable current source 214 (e.g., a 0-10 amp programmable current source). In addition, the wafer probe system 202 includes safety circuits that minimize or prevent damage to respective system components. In particular, collector (drain) current limiters 5*b* and emitter (source) current limiters 5*a* are operative to limit or clamp test current injected into the device under test (DUT) 4. The respective current limiters 5*b* and 5*a* will be described in more detail below.

The wafer probe system 202 also may include a voltage measurement device 222 for measuring a voltage between the collector current limiters 5*b* and the emitter current limiters 5*a*. Preferably, the voltage measurement device 222 is a digital voltage sensing circuit or the like. As will be described in more detail below with respect to FIG. 18, the voltage measurement obtained by the voltage measurement device 222 can be used to determine a contact resistance between the probes and the DUT 4.

Further, the wafer probe system 202 may include various interfaces 224 that enable signals to be communicated to external equipment (e.g., scope trigger, emitter sense, collector voltage, collector current, gate sense, etc.), as well as various communication interfaces 226 for establishing communications between devices. These communication interfaces 226 may include, for example, an Ethernet interface, an RS-232 interface, an IEEE-488 interface, etc. In addition, the wafer probe system 202 may include various test points 228 accessible to external equipment, e.g., UIS tester 1 (FIG. 7) (e.g., to obtain voltage measurements at nodes of interest, etc.) and 230 (FIG. 8) (e.g., to provide high voltage power to the system 200*b*). The external equipment then may analyze the data and make a determination of whether or not the DUT 4 is acceptable.

The wafer probe system 202 is coupled to the motherboard 204 via ribbon cables 232 or the like. In the exemplary systems 200*a* and 200*b* of FIGS. 7 and 8, the motherboard 204 is used to implement the desired testing configuration (e.g., inductive switching or resistive switching). Details of the respective configurations are described below with respect to FIGS. 8 and 9.

In addition to being coupled to the wafer probe system 202 via the ribbon cables 232, the motherboard 204 also may be coupled to the probe card 45, the chip carrier 210, and the DUT 4. For example, electrical conductors from the motherboard 204 can be connected to terminals (not shown) of the probe card 45. These terminals in turn may be coupled to probes 2 that contact the bonding pads of a DUT 4, or are directly connected to the chip carrier 210.

The probe card 45 and chip carrier 210 may be mounted to or otherwise supported by the probe card fixture 206 (e.g., a circuit board or the like). Moreover, by housing the probe card 45 and chip carrier 210 separate from the wafer probe system 202 and motherboard 204, the probe card 45 and chip carrier 210 can be moved within the work environment while the wafer probe system 202 remains stationary (or substantially stationary).

Figure 9:
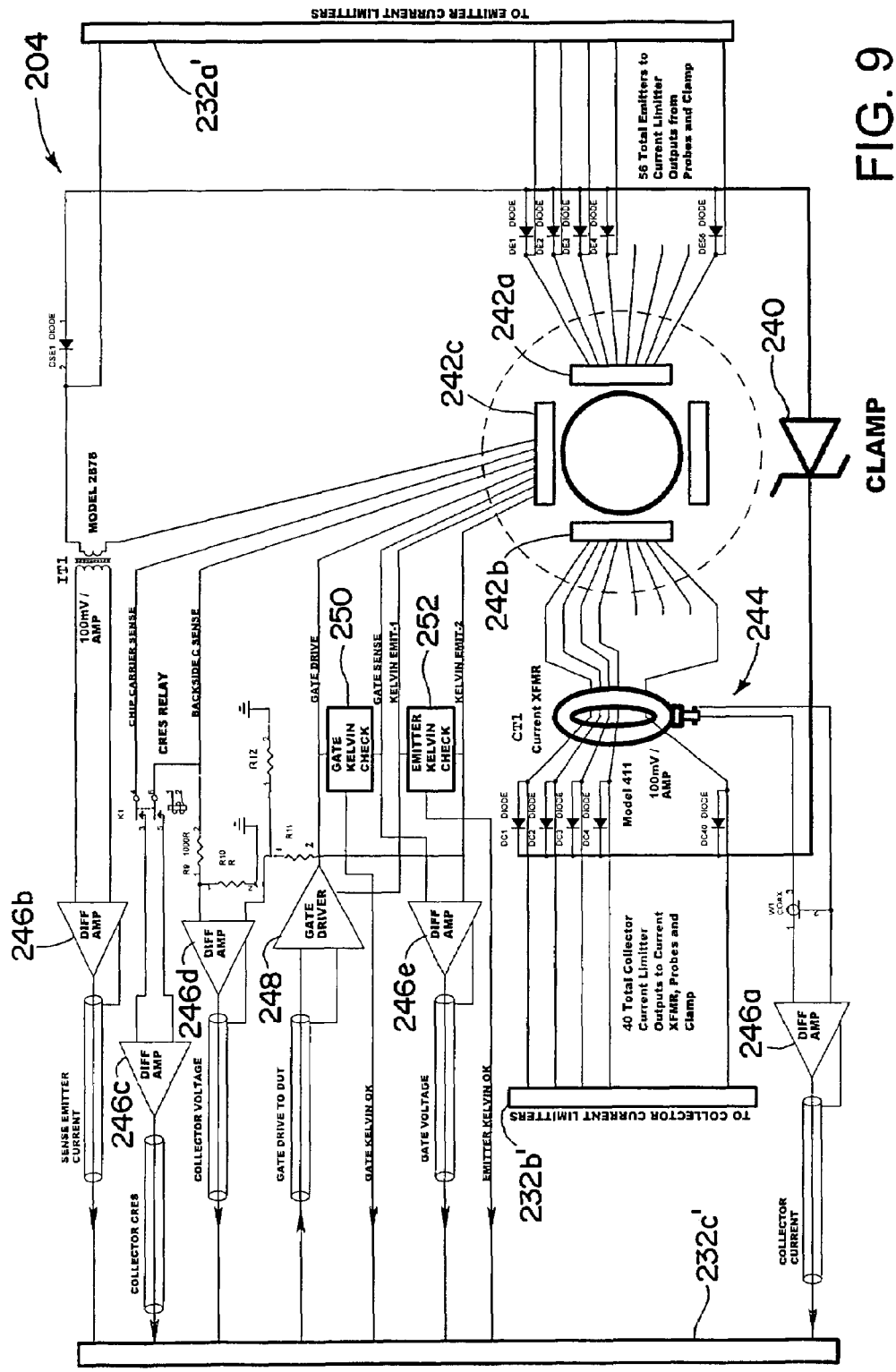
FIG. 9 is a schematic diagram of an exemplary motherboard for use with the system of FIG. 7.

Referring now to FIG. 9, a schematic diagram of an exemplary motherboard 204' configured for inductive switching is shown. The exemplary motherboard 204' may be used in conjunction with the system 200a shown in FIG. 7, for example.

The motherboard 204' includes ribbon cable connectors 232a' (emitter/source) 232b' (collector/drain) and 232c' (signal), each having a plurality of terminals (not shown) for connecting the motherboard 204' to the wafer probe system 202. Control signals, data signals, and the like may be exchanged between the wafer probe system 202 and the motherboard 204' via ribbon cables 232a-232c and respective connectors 232a'-232c'. Further, a plurality of diodes DE1-DE56 and DSE1 are connected together at their respective anodes, while an anode of zener diode 240 (also referred to as clamp 240) is connected to the anodes of diodes DE1-DE56 and DSE1. The cathodes of diodes DE1-DE56 are connected to individual terminals of connector 242a, and each of these terminals may be coupled to a respective probe 2 (not shown in FIG. 9) of probe card 45 (e.g., one cathode and one probe per terminal). The terminals and corresponding probes enable signals to be provided to or obtained from the DUT 4. Further, the cathodes of diodes DE1-DE56 and DSE1 are coupled to respective terminals of the emitter connector 232a'. The cathode of diode DSE1 also is coupled to a first input terminal of a current transformer CT2.

The cathode of clamp 240 is coupled to each cathode of diodes DC1-DC40, while each anode of diodes DC1-DC40 is connected to respective terminals of connector 242b (one anode per terminal). As above, the each terminal of connector 242b may be coupled to a respective probe 2 of the probe card 45 so as to provide and/or obtain signals to/from the DUT 4. Further, each anode of diode DC1-DC40 is coupled to a respective terminal of connector 232b'.

A current transformer CT1 monitors the total current passing through the DUT 4, and a signal 244 from the current transformer CT1 is provided to an input of differential amplifier 246a, while the output of the differential amplifier 246a is provided to a terminal of signal connector 232c'. The output of differential amplifier 246a represents collector current.

Moving back to the current transformer CT2, a second input terminal of isolation transformer IT1 is connected to a terminal of connector 242c, which in turn may be connected to a probe 2 (not shown in FIG. 9). The output terminals of the current transformer CT2 are connected to the input of differential amplifier 246b, and the output of differential amplifier 246b is connected to a terminal of signal connector 232c', thereby enabling the signal to be monitored by the wafer probe system 202. The output of differential amplifier 246b represents the sense emitter current.

Further, a chip carrier sense signal and a backside collector sense signal are obtained from the DUT 4 via respective terminals of connector 242c and probes 2 coupled thereto. These signals are provided to relay K1 (e.g., at terminals 4 and 6 of relay K1), while normally open poles of relay K1 (i.e., terminals 3 and 5) are connected to the input of differential amplifier 246c. The output of differential amplifier 246c, which represents the carrier-to-collector voltage used to compute contact resistance measurement, is connected to a terminal of signal connector 232c' for monitoring by the wafer probe system 202. By controlling the operation of relay K1 (e.g., by applying voltage to coil terminals 1 and 2), the output of the differential amplifier 246c can be toggled between zero volts and the carrier-to-collector voltage.

The backside collector sense signal along with a Kelvin emitter-2 signal (which is obtained from the DUT 4 via a terminal and probe connected to connector 242c) are provided to the input of differential amplifier 246d. Resistor dividers R9, R10, and R11, R12, reduce and condition the input voltage to the differential amplifier. The output of differential amplifier 246d, which represents the collector voltage, is connected to a terminal of signal connector 232c' for monitoring by the wafer probe system 202.

A gate sense signal, which is obtained from the DUT 4 via a probe 2 (not shown) connected to a terminal of connector 242c, and the Kelvin emitter-2 signal are provided to an input of differential amplifier 246e. The output of differential amplifier 246e, which represents the gate voltage, is connected to a terminal of signal connector 232c' and provided to the wafer probe system 202.

A gate driver signal obtained from the wafer probe system 202 is obtained via a terminal of connector 232c' and connected to an input of gate driver 248. Further, a Kelvin emitter-1 signal is obtained from the DUT 220 via probe 2 (not shown in FIG. 9) connected to a terminal of connector 242c. An output of the gate driver 248 then is provided to the DUT 4 via a terminal of connector 242c and a probe 2 connected thereto. The gate driver 248 provides gating signals for the DUT 4.

The output of the gate driver 248 and a gate sense signal (which is obtained from the DUT 4 via probe 2 and connector 242c) are provided to a gate sense Kelvin check circuit 250. Similarly, an emitter sense Kelvin check circuit 252 receives both a Kelvin emitter-1 signal and the Kelvin emitter-2 signal from the DUT 4 via respective probes 2 connected to corresponding terminals of connector 242c. Outputs of the gate sense Kelvin check circuit 250 and the emitter sense Kelvin check circuit 252 are provided to the wafer probe system 202 via respective terminals of signal connector 232c'.

The exemplary motherboard 204' is configured to perform unclamped switching of the device (e.g., an avalanche test), wherein the device is subjected to industry standard ruggedness test conditions (e.g., a test wherein the breakdown voltage of the device is exceeded and the device is forced to absorb energy). Based on collected data, a determination can be made as to whether the device can absorb the energy without damage. During the unclamped switching test, clamp 240 is removed from the circuit.

Another test performed by the exemplary motherboard 204' is a clamped inductive switching test (e.g., a test for determining if the device can switch a predetermined amount of current within timing limits without latching on or off). During this test, the voltage seen by the device is limited so as not to exceed a predetermined level. If the voltage does exceed the predetermined level, the energy is dissipated through the clamp 240 and diodes DE1-DE56 and DC1-DC40.

In both the clamped and unclamped tests, actual current data is obtained from current transformer CT1 and provided to the wafer probe system 202 via differential amplifier 246a and signal connector 232c'.

During the inductive switching tests, current passes through the DUT 4. Due to the inductive nature of the test, energy is stored within the system. When DUT 4 is the clamp will clamp the voltage across the DUT 4 Note that during clamped tests, the DUT 4 will not be subjected to high voltage spikes.

To protect the DUT 4 during the clamped test, the clamp 240 along with diodes DE1-DE56, DC1-DC40 effectively provide a current path through which the stored current may dissipate. In other words, when the clamp is active, the voltage seen by the DUT 4 is limited to a predetermined clamp value. This keeps the voltage across the DUT 4 from exceeding its breakdown voltage. The clamp circuit may be a passive circuit that activates when the voltage level across the DUT 4 exceeds its preset level.

During the clamped or unclamped inductive switching test, the current that passes through the device may be monitored relative to the gate signals applied to the DUT (e.g., via the current transformer CT1 and the differential amplifier circuits 246a-246e). The monitored current can be used as the switching waveform. Should the clamp 240 be activated (e.g., during a clamped inductive switching test), then the DUT current passes through the clamp 240 and diodes DE1-DE56 and DC1-DC40, and not the DUT 4 or current transformer CT1.

During operation in either clamped or unclamped mode, data is collected and provided to the wafer probe system 202 via differential amplifier circuits 246a-246e. Such differential amplifier circuits are well known and, therefore, will not be described herein.

Moving now to the Kelvin check circuits (the gate sense Kelvin check circuit 250 and emitter sense Kelvin check circuit 252), these circuits effectively provide information regarding continuity between a probe tip 90 and a bonding pad 3 for the gate and emitter, respectively. The output of the respective Kelvin check circuits 250 and 252 provides information that can be used to make sure that the respective probes have a reasonably low resistance to the same bonding pad on the chip.

Figure 10:
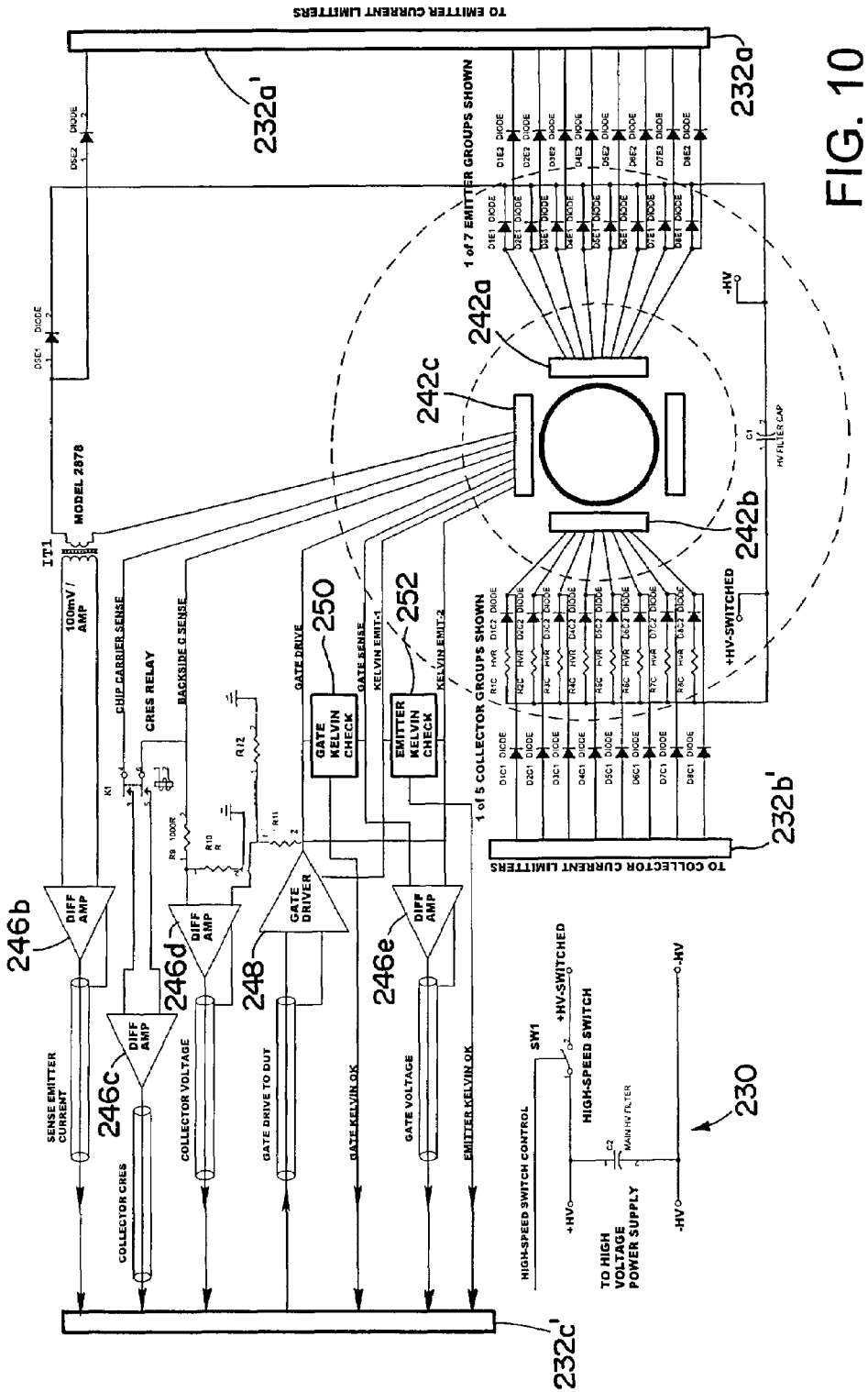
FIG. 10 is a schematic diagram of an exemplary motherboard for use with the system of FIG. 8.

Moving now to FIG. 10, there is shown another exemplary motherboard 204" configured for resistive switching. The motherboard 204" may be used in the system 200b of FIG. 8, for example. Further, the motherboard 204" includes many of the same components as the motherboard 204' of FIG. 9. For sake of brevity, only those portions of motherboard 204" that differ from motherboard 204' will be described. (emitter/source) 232b' (collector/drain) and 232c' (signal), each having a plurality of terminals (not shown) for connecting the motherboard 204' to the wafer probe system 202 via ribbon cables 232a-232c or the like. A plurality of diodes D1E1-D8E1 are connected together at their respective cathodes. The anodes of diodes D1E1-D8E1 are connected to individual terminals of connector 242a, and each of these terminals may be coupled to a respective probe 2 (not shown in FIG. 10) of probe card 45 (e.g., one cathode and one probe per terminal). The terminals and corresponding probes enable signals to be provided to or obtained from the DUT 4. Further, the anodes of diodes D1E1-D8E1 are coupled to respective anodes of diodes D1E2-D8E2, and the cathodes of diodes D1E2-D8E2 are connected to respective terminals of the emitter connector 232a'.

The anodes of diodes DSE1 and DSE2 are connected together and to a first terminal of current transformer CT1. The cathode of diode DSE1 is connected to the cathodes of diodes D1E1-D8E1, while the cathode of diode DSE2 is connected to a terminal of the emitter connector 232a'.

The anodes of diodes D1C1-D8C1 are connected to respective terminals of the collector connector 232b'. The cathodes of diodes D1C1-D8C1 are connected to the cathodes of diodes D1C2-D8C2, respectively, and the cathodes of each diode pair are connected to the DUT 4 via a probe 2 (not shown in FIG. 10) connected to a terminal of connector 242b.

Each anode of diodes D1C2-D8C2 is connected to a respective resistor R1C-R8C (i.e., to a first terminal of the respective resistor). A second terminal of each resistor is connected to a first terminal of a filter capacitor C1, and a second terminal of the filter capacitor C1 is connected to the cathodes of diodes D1E1-D8E1 and DSE1. A high voltage power supply 230 includes a switch SW1, which provides power to the first capacitor C1.

Diodes D1C1-D8C1 and D1E1-D8E2 are operative to block reverse current from the test voltages (i.e., the power supply 230) going back into the current limiters 5b and 5a. It is noted that the current limiters 5b and 5a are not used during resistive switching. Instead, the current limiters 5b and 5a are used only to perform measurement of contact resistance. Actual current limiting is provided by resistors R1C-R8C (which limit current to respective probes 2). The aggregate of all the resistors provides a load for the DUT 4. In other words, a device includes a resistor in the drain/collector circuit and a voltage is imposed across the device, so that when the device turns on, it has a particular current flowing through it, and when it turns off, it has the voltage of the power supply 230 across it. Diodes D1C2-D8C2 and D1E1-D8E1 prevent the resistors from shunting across the contacts when a contact resistance measurement is performed. In other words, these diodes block the load resistors from interfering with the contact resistance measurement.

Figure 11:
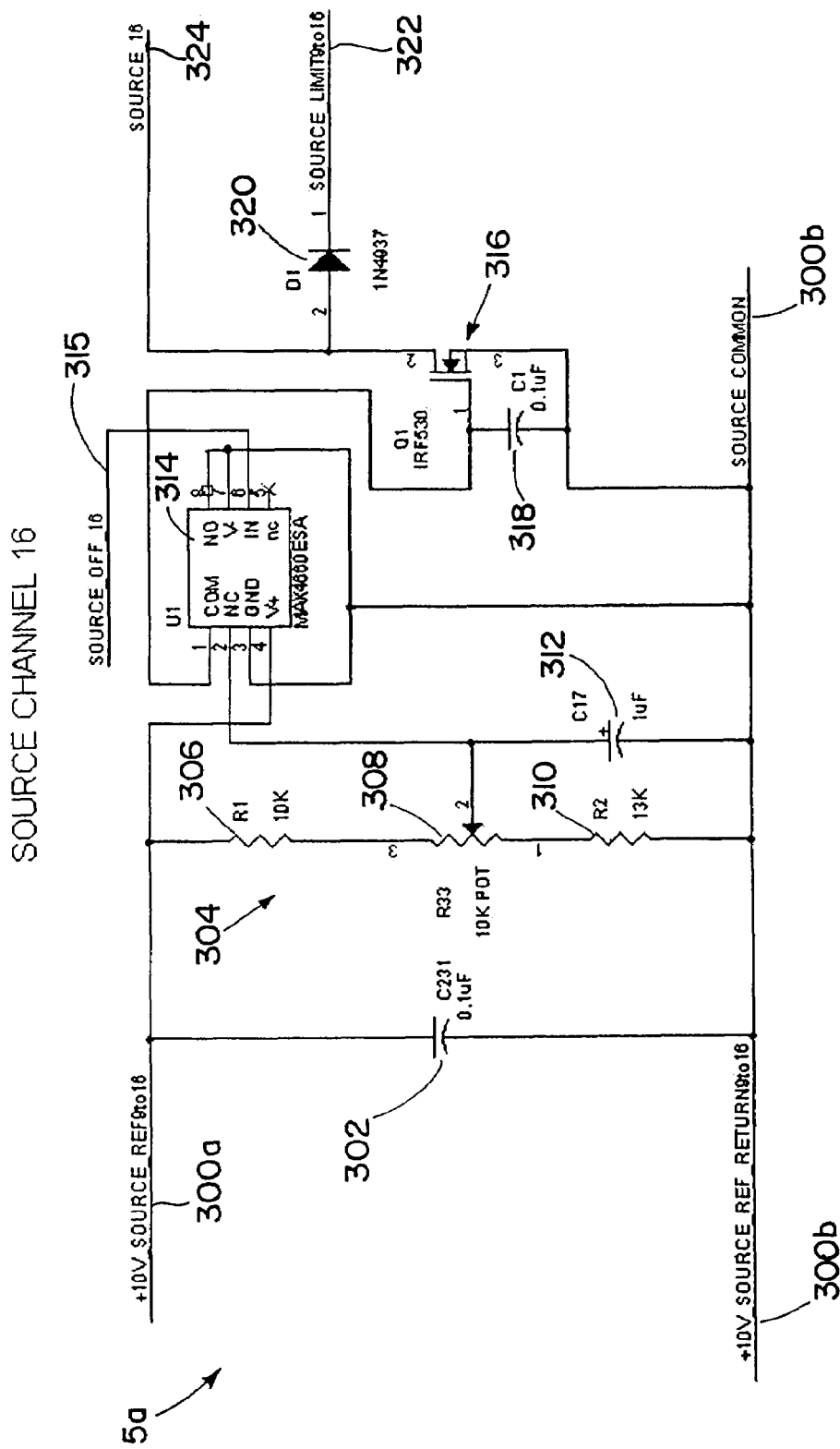
FIG. 11 is a schematic diagram of an exemplary source current limiter circuit in accordance with the invention.

Referring now to FIG. 11, a schematic diagram of an exemplary current limiter circuit is shown. The current limiter circuit is a source (emitter) current limiter circuit 5a. A drain (collector) current limiter circuit 5b will be described below with respect to FIG. 12.

The source current limiter circuit 5a is coupled to a power source (e.g., a 10 V SOURCE REF line 300a and a corresponding 10V SOURCE REF RETURN line 300b). The power may be provided via an isolated DC-DC converter, for example. A capacitor 302 or other filtering means may be coupled between the SOURCE REF line 300a and SOURCE REF RETURN line 300b (also referred to as SOURCE COMMON 300b), and can filter high frequency noise, for example. Further, a voltage divider circuit 304 or the like may be connected in parallel to the capacitor 302. The voltage divider circuit 304 provides an adjustable voltage output as described below.

The exemplary voltage divider circuit 304 includes a first resistor 306, a variable resistor 308 and a second resistor 310. A first terminal of the first resistor 306 is connected to the 10V SOURCE REF line 300a, and a second terminal of the resistor 306 is connected to a first terminal of the variable resistor 308. A second terminal of the variable resistor 308 is connected to a first terminal of the second resistor 310, and a third terminal of the variable resistor 308, which is the voltage output connection of the voltage divider 304, is coupled to a first terminal of a capacitor 312 and to a normally closed (NC) pole of analog switch 314 (e.g., a single pole, double throw analog switch). The second terminal of the resistor 310 and the second terminal of the capacitor 312 are both connected to the 10V SOURCE REF RETURN line 300b. As described in more detail below, the voltage divider circuit provides a bias voltage that can be used to turn the current limiter circuit 5a on and off.

Terminal V+ of the analog switch 314 is connected to the 10 V SOURCE REF line 300a, while the normally open pole (NO), the V− terminal, and the ground terminal (GND) of the analog switch 314 are connected to the 10V SOURCE REF RETURN line 300b. Terminal IN, which is coupled to the SOURCE OFF line 315, controls operation of the analog switch. For example, by applying or removing a control signal at the SOURCE OFF line 315 (and thus terminal IN), the voltage level at the COM pole of the analog switch 314 is toggled between SOURCE COMMON line 300b and the voltage divider output (i.e., the voltage across capacitor 312). Thus, each source (collector) current limiter circuit 5b can be individually enabled or disabled via the SOURCE OFF line 315. An isolated eight bit port, for example, may be used to provide control signals to the individual analog switches at each current limiter channel.

Further, the common pole (COM) of the analog switch 314 is connected to the gate of pass device 316 (e.g., an n-channel insulated gate FET), while the source of the pass device 316 is connected to the SOURCE REF RETURN line 300b. A capacitor 318 is connected between the gate and source of the pass device 316. The drain of the pass device 316 is connected to the anode of diode 320, and the cathode of diode 320 is connected to a source limit line 322. Although not shown, the exemplary source current limiter circuit 5a includes sixteen source limit lines, each including a diode coupled thereto. The anode of diode 320 and drain of pass device 316 are connected to a SOURCE line 324.

The SOURCE COMMON line 300b is bussed to all source current limiters, and connects back to the tester 1, the SCR trigger circuit 6, and the current source and current measurement circuits (which may be used to measure contact resistance as described below). It is noted that the SOURCE COMMON line 300b is the most negative point in the source current limiter circuit 5a. Further, both the source current limiters 5a and drain current limiters 5b (described below) float relative to chassis ground.

In operation, the voltage divider 304 of the source current limiter circuit 5a charges capacitor 312 and, once charged, the voltage is provided to the NC pole of the analog switch 314, while the NO pole of analog switch 314 is coupled to the SOURCE COMMON line (e.g., at zero volts). Based on a control signal present at the SOURCE OFF line 315, the analog switch 314 couples wither the NC pole or the NO pole to the COM pole, which then is provided to the gate of pass device 316 (i.e., the gate voltage is set to either the preset bias value as provided by the voltage divider circuit 204 or to 0 volts). In other words, the pass device is turned on or off via the SOURCE OFF line 315. As will be appreciated by those skilled in the art, the voltage divider circuit 304 may be adjusted so as to properly bias the pass device 316. Capacitor 318 provides a low AC impedance to hold the gate voltage of the pass device 316 constant during test pulses despite Miller capacitance feedback. It should also be emphasized that the current limiters should not affect any Avalanche, RBSOA, Inductive Switching or even Resistive Switching testing.

Diode 320 feeds into a common bus that provides a diode "OR" connection of sixteen source limiter channels. The channel having the highest voltage between SOURCE COMMON line 300b and corresponding SOURCE line 324 will predominate, thereby turning the diode 320 on. This signal then is compared to a reference to determine if excessive voltage exists across any of the current limiters. If so, the SCR trigger circuit 6 is activated.

For example, the current limit function of the current limiter circuit 5a is enabled and disabled by applying a bias voltage to the gate of pass device 316 (e.g., the voltage from voltage divider 304 or SOURCE COMMON 300b, via analog switch 314, is routed to the gate of the pass device 316). As a particular probe 2 draws more and more current, the voltage across its corresponding pass device 316 will rise. Eventually, the pass device 316 will come out of saturation and enter current limiting mode, whereby current through the probe 2 is held at a steady value. If the particular probe has a lower contact resistance than other probes, the voltage across its respective pass device 316 will continue to rise.

The voltage across each pass device 316 is "OR'd" together via diode 320 (each pass device includes a corresponding diode connected to its drain/collector). Thus, the pass device 316 seeing the highest voltage relative to other pass devices will dominate, and its corresponding diode 320 will conduct. The diodes corresponding to the other pass devices will not conduct, since, in the present example, the voltage across these pass devices is lower.

As a result of the diode OR function, the highest voltage seen by any pass device 316 is provided to the trigger circuit 6. If that voltage exceeds a predetermined level, the SCR 7 is enabled, thereby shunting current away from the device and probes.

The current limit circuit described herein effectively provides an open loop current limiter (e.g., they operate without using a feedback signal of the controlled parameter). The system will always limit current whether or not current is flowing through the circuit. Operation of the circuit is dependent on the characteristics of the pass device, and not on an active feedback loop. The open loop current limiter is advantageous in that a feedback signal is not required, which removes the possibility of instability in the system.

Figure 12:
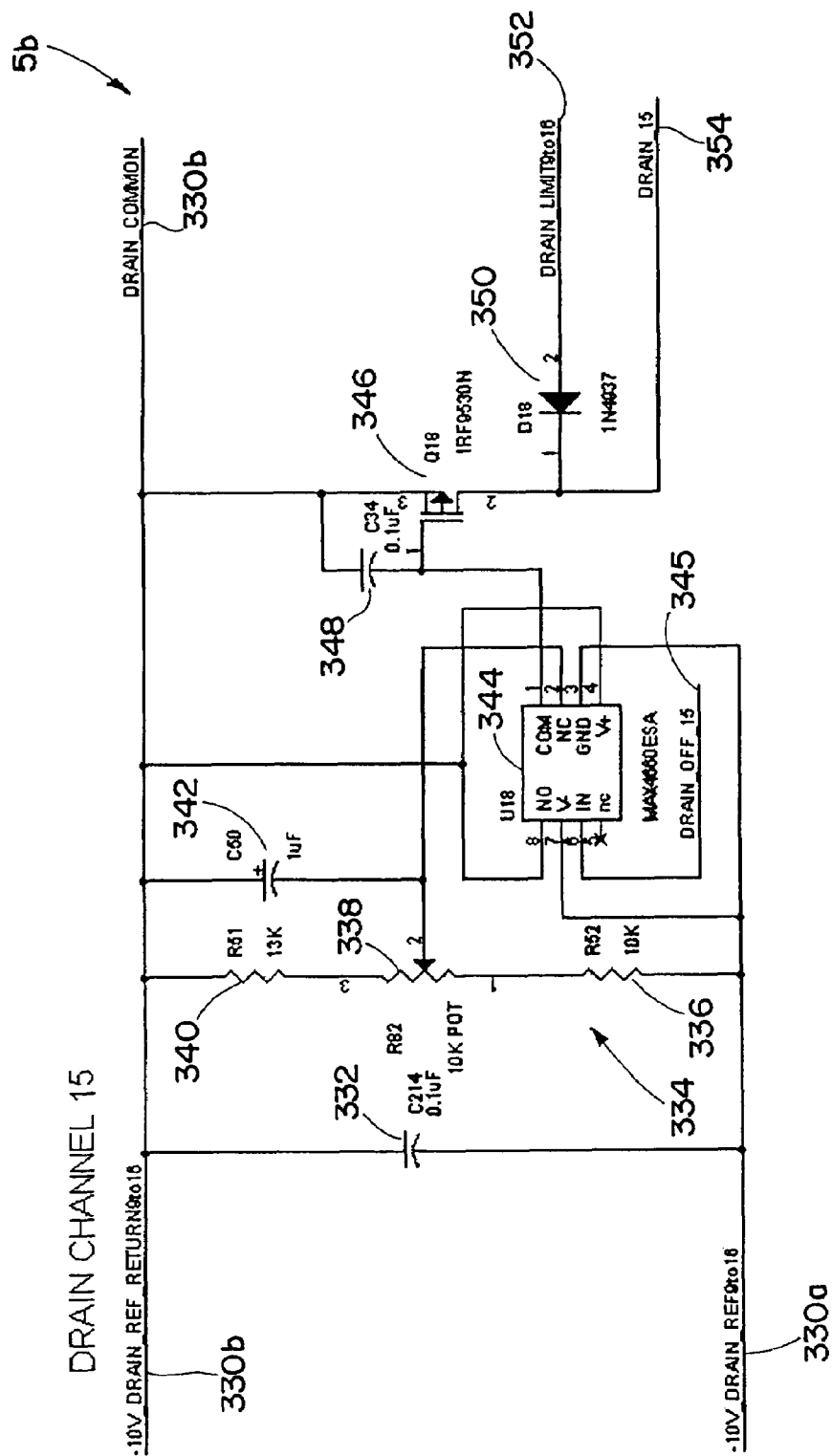
FIG. 12 is a schematic diagram of an exemplary drain current limiter circuit in accordance with the invention.

FIG. 12 is a schematic diagram of an exemplary drain (collector) current limiter circuit 5b. The drain current limiter circuit 5b is similar to the source limiter circuit 5a except that the relative polarities are reversed, which necessitates some re-arrangement of some of the circuit elements (e.g., the analog switch).

The drain current limiter circuit 5b is coupled to a power source (e.g., a −10 V DRAIN REF line 330a and a corresponding −10V DRAIN REF RETURN line 330b). Like the source current limiter circuit 5a above, the power may be provided via an isolated DC-DC converter. A capacitor 332 or other filtering means may be coupled between the DRAIN REF line 330a and DRAIN REF RETURN line 330b (also referred to as DRAIN COMMON 330b). Further, a voltage divider circuit 334 or the like may be connected in parallel to the capacitor 332.

The exemplary voltage divider circuit 334 includes a first resistor 336, a variable resistor 338 and a second resistor 340. A first terminal of the first resistor 336 is connected to the −10V DRAIN REF 330a, and a second terminal of the resistor 336 is connected to a first terminal of the variable resistor 338. A second terminal of the variable resistor 338 is connected to a first terminal of the second resistor 340, and a third terminal of the variable resistor 338, which is the voltage output connection of the voltage divider 334, is coupled to a first terminal of a capacitor 342 and to a normally closed (NC) pole of analog switch 344 (e.g., a single pole, double throw analog switch). The second terminal of the resistor 340 and the second terminal of the capacitor 342 are both connected to the DRAIN REF RETURN line 330b.

Terminals V− and GND of the analog switch 344 are connected to the −10 V DRAIN REF line 330a, while terminals V+ and the NO pole of the analog switch 344 are connected to the DRAIN REF RETURN line 330b. Like the analog switch 314 above, terminal IN of analog switch 344 controls operation of the analog switch. For example, by applying or removing a control signal at the DRAIN OFF line 345 (and thus terminal IN), the voltage level at the COM pole of the analog switch 314 is toggled between the DRAIN REF RETURN line 330b and the voltage divider output (i.e., the voltage across capacitor 342). Thus, the drain (emitter) current limiter circuits 5a also can be individually enabled or disabled.

Further, the common pole (COM) of the analog switch 344 is connected to the gate of pass device 346 (e.g., a p-channel insulated gate FET), while the source of the pass device 346 is connected to the DRAIN REF RETURN line 330b. A capacitor 348 is connected between the gate and source of the pass device 346. The drain of the pass device 346 is connected to the cathode of diode 350, and the anode of diode 350 is connected to a drain limit line 352. Although not shown, the exemplary drain current limiter circuit 5b includes sixteen drain limit lines, each including a diode coupled thereto. The cathode of diode 350 and drain of pass device 346 are connected to a DRAIN line 354.

With respect to the drain current limiter circuit 5b, it is noted that a p-channel pass device is used, and that a −10V reference is provided to the circuit. Further, the analog switch is connected differently to allow operation in a reversed polarity environment, but performs the same control function as described with respect to the source current limiter. Again, a diode "OR" arrangement allows the channel with the greatest voltage drop to control the SCR crowbar trigger circuit 6 when the voltage across the channel exceeds the set limits. Switching the channel on or off may be done via an isolated eight bit port as described with respect to the source channels. Two ports are used to control sixteen channels. Since operation of the drain current limiter circuit 5b is similar to the source current limiter circuit 5a, operation of the drain current limiter circuit will not be discussed for sake of brevity.

Several current limiter boards may be used in a system to provide a sufficiency of channels to allow high test currents to be passed. Typically, each channel is connected to just one contacting probe, and the control system allows any combination of source and drain channels to be turned on.

Figure 13:
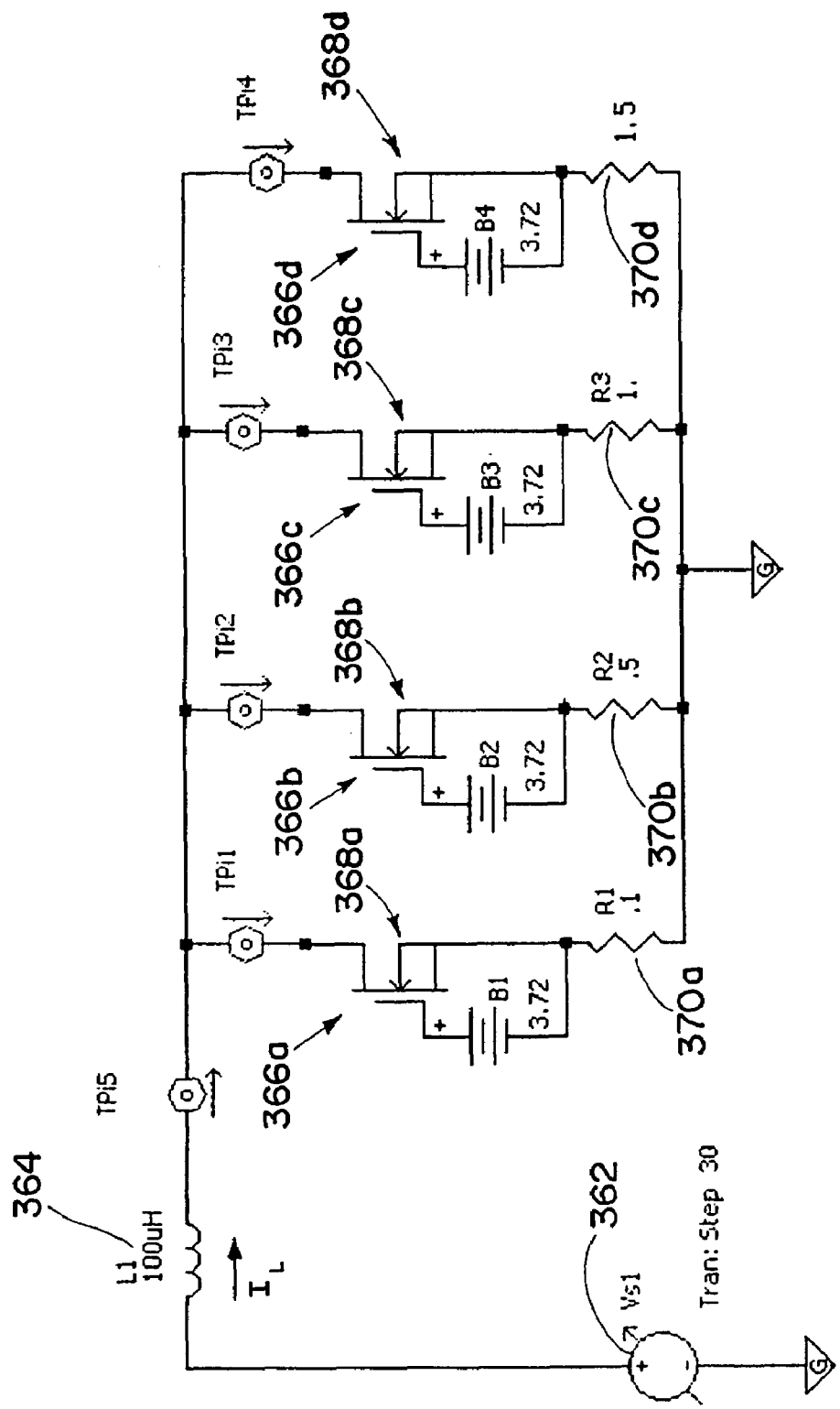
FIG. 13 is a schematic diagram of an exemplary simulation circuit for simulating the current limiters of FIGS. 10 and 11.

Referring now to FIG. 13, a simulation circuit 360 for the source (emitter) and drain (collector) current limiters is shown. The circuit 360 is similar to the circuit provided for unclamped inductive switching test in that an inductor is charged over a period of time via a fixed voltage source. The simulation circuit 360 includes a voltage source 362 connected to a series inductor 364 (together, which corresponds to the UIS tester 1 of FIG. 7) feeding four separate probe current limiter circuits 366a-366d. Each probe current limiter circuit 366a-366d includes a MOSFET device 368, wherein a drain of each MOSFET is connected to the inductor 364, and the gate of each MOSFET is biased with respect to the source of the MOSFET. Further, the source of each MOSFET 368a-368d is coupled to a first terminal of a respective resistor 370a-370d, and a second terminal of each respective resistor 370a-370d is connected to common. The resistors 370a-370d represent typical probe contact resistances that might be encountered during a test.

During simulation, the current in each probe current limiter circuit 366a-366d rises in a linear manner until the voltage source is turned off, or some other element of the circuit limits the current flow. In the exemplary simulation, four MOSFETs are used as probe current limiters, each having a fixed bias supply to the gate that sets the point at which the device goes into constant current according to the characteristic curves of the device. In the present example, the bias is set to 3.72 volts, which sets the current limiting to about 5 Amperes. As will be appreciated by those skilled in the art, the bias and corresponding current limit may vary based on the specific devices used in the simulation. Test points 1-5 are current monitoring points used by the simulation program for data presentation.

Figure 14:
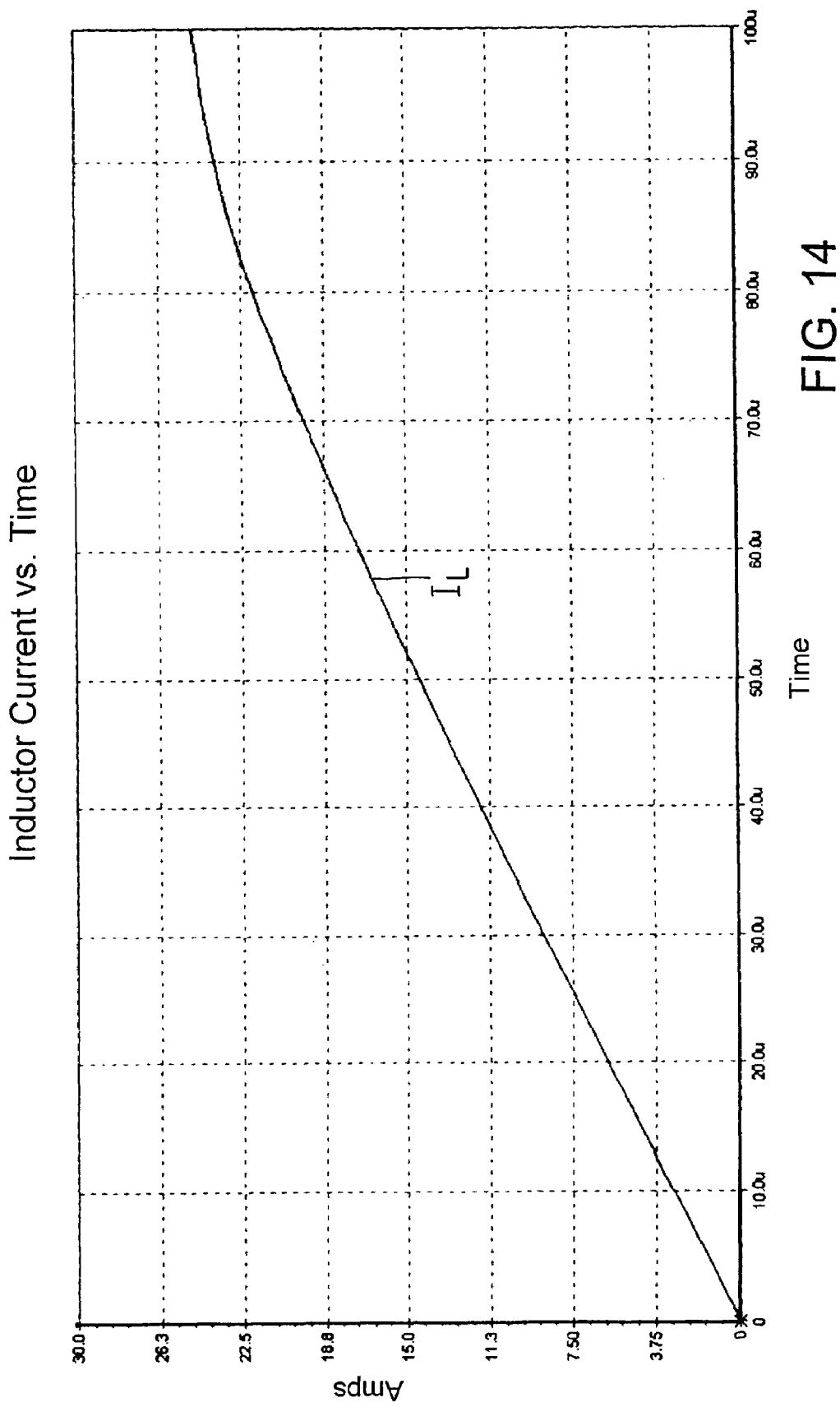
FIG. 14 is a graph showing inductor current versus time for the simulation circuit of FIG. 13.

With further reference to FIG. 14, a graphical representation of inductor current $I_L$ in amps versus time in microseconds is shown. It is noted that the inductor current $I_L$ rises linearly until approximately 80 microseconds. This is the point at which the test current begins to exceed the current limit of all four limiters 366a-366d. A normal test might be set to end the current ramp up at about 15 amps. Typically, the test would be configured so that it could proceed even if one probe had excessive contact resistance. In this case, three limiters providing 5 amperes would allow a total current of 15 amperes, even if the fourth contact was passing minimal current.

Figure 15:
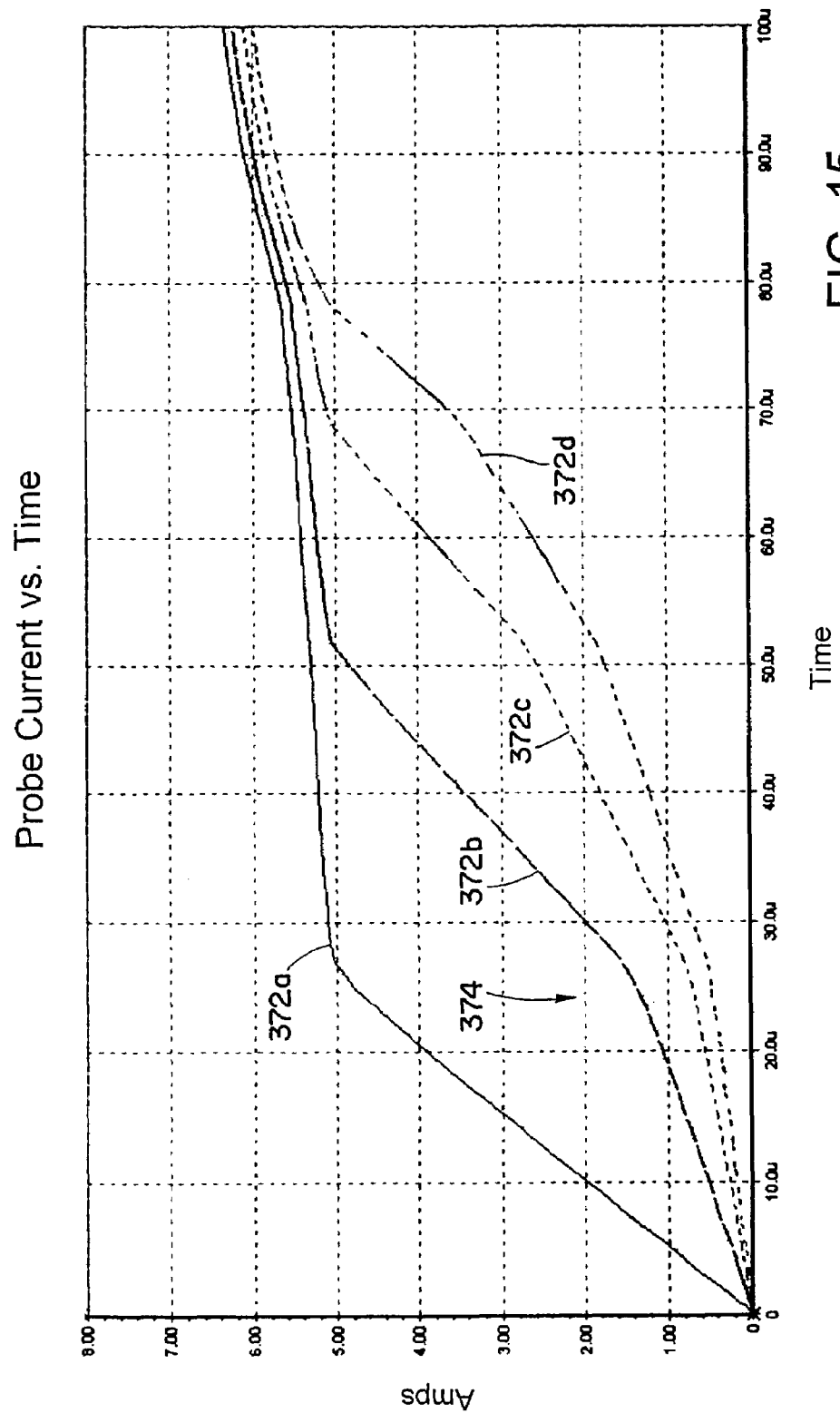
FIG. 15 is a graph showing probe current versus time for the simulation circuit of FIG. 13.

FIG. 15 is a graphical diagram showing the individual currents of each probe current limiter circuit 366a-366d. Traces 372a-372d represent the current in amperes for current limiter circuits 366a-366d, respectively. In the first current limiter circuit 366a, the probe (represented by resistor 370a) has the least resistance and, therefore, current rises rapidly. At about 27 μsec, the first probe current limiter circuit 366a goes into current limit, and as the inductor current $I_L$ continues to rise, the voltage across the other probe resistances will rise, causing them to carry more current (see the inflection point 374 on traces 372b-372d). The current will continue to rise until the second probe current limiter circuit 372b reaches its current limit at about 50 μsec. At this time, the current in the remaining two probe current limiter circuits 372c and 372d rises rapidly after 50 μsec.

Figure 16:
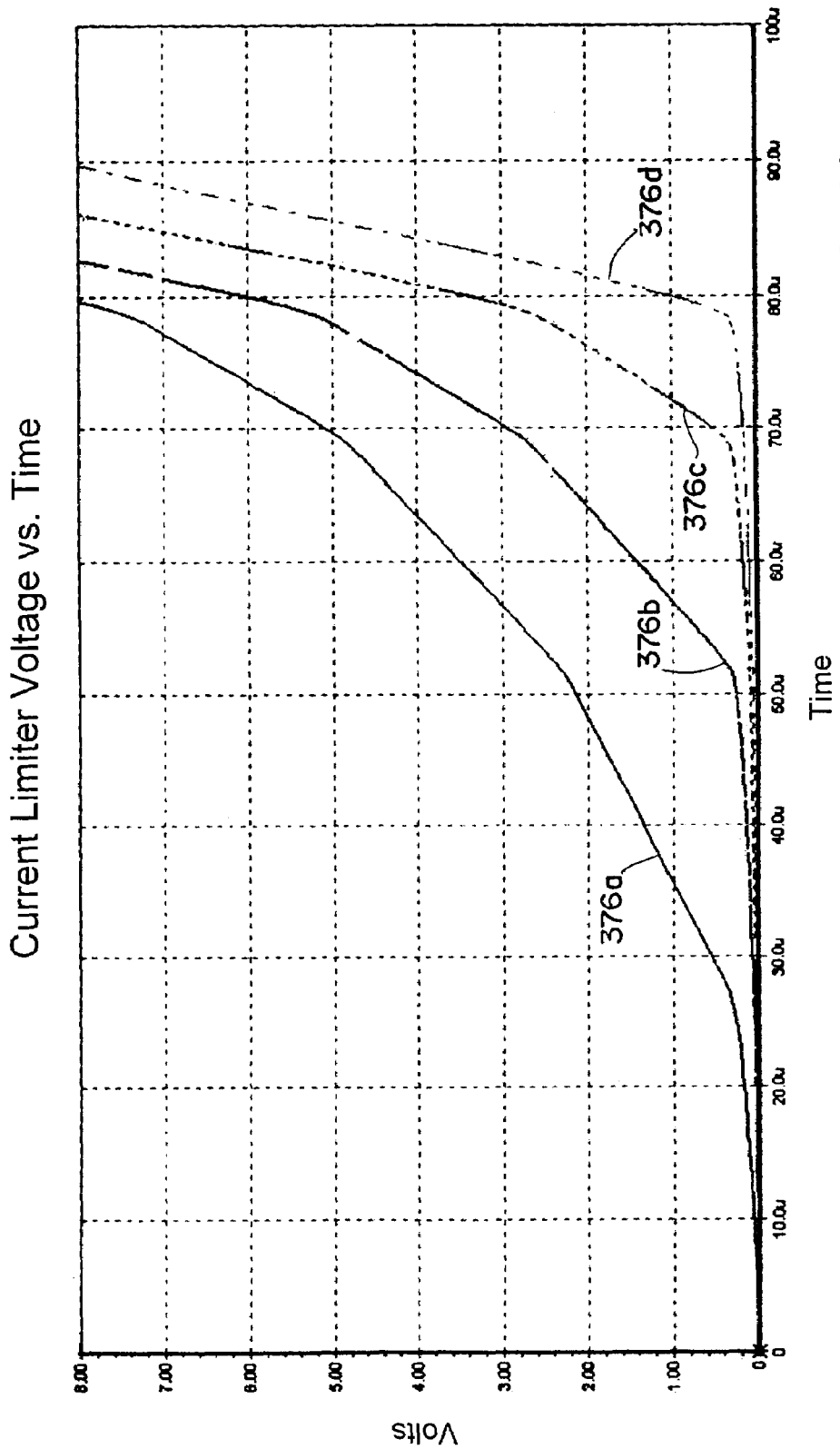
FIG. 16 is a graph showing current limiter voltage versus time for the simulation circuit of FIG. 13.

FIG. 16 shows the voltage across each probe current limiter circuit 366a-366d in volts versus time in micro seconds. As can be seen in curves 376a-376d (corresponding to circuits 366a-366d), once a probe has gone into current limit mode, the voltage across the limiter rapidly rises. This voltage is present across the other series combinations of current limiters and contact resistances. Therefore, one channel going into current limit will force the voltage to increase across other contact resistances, causing them to carry more current. The current flow is not by nature balanced for all of the probes, but better sharing of current and, more importantly, over current protection of the lowest resistance probes is achieved by this circuit arrangement.

During failure of a DUT or, in the case of having insufficient good probes to conduct the required test current, the voltage across all of the current limiters will continue to rise. Damage can occur to probes if the voltage across the contact resistance rises excessively, or worse, if any of the current limiting MOSFETs go into avalanche and lose their ability to control current flow. To minimize this risk, the voltage across the current limiters is monitored and, if it exceeds a predetermined safe value (e.g., about 10 volts), the crowbar trigger circuit 6 activates the SCR 7, thereby shunting the test current away from the probes and current limiters, thus protecting them from damage.

Figure 17:
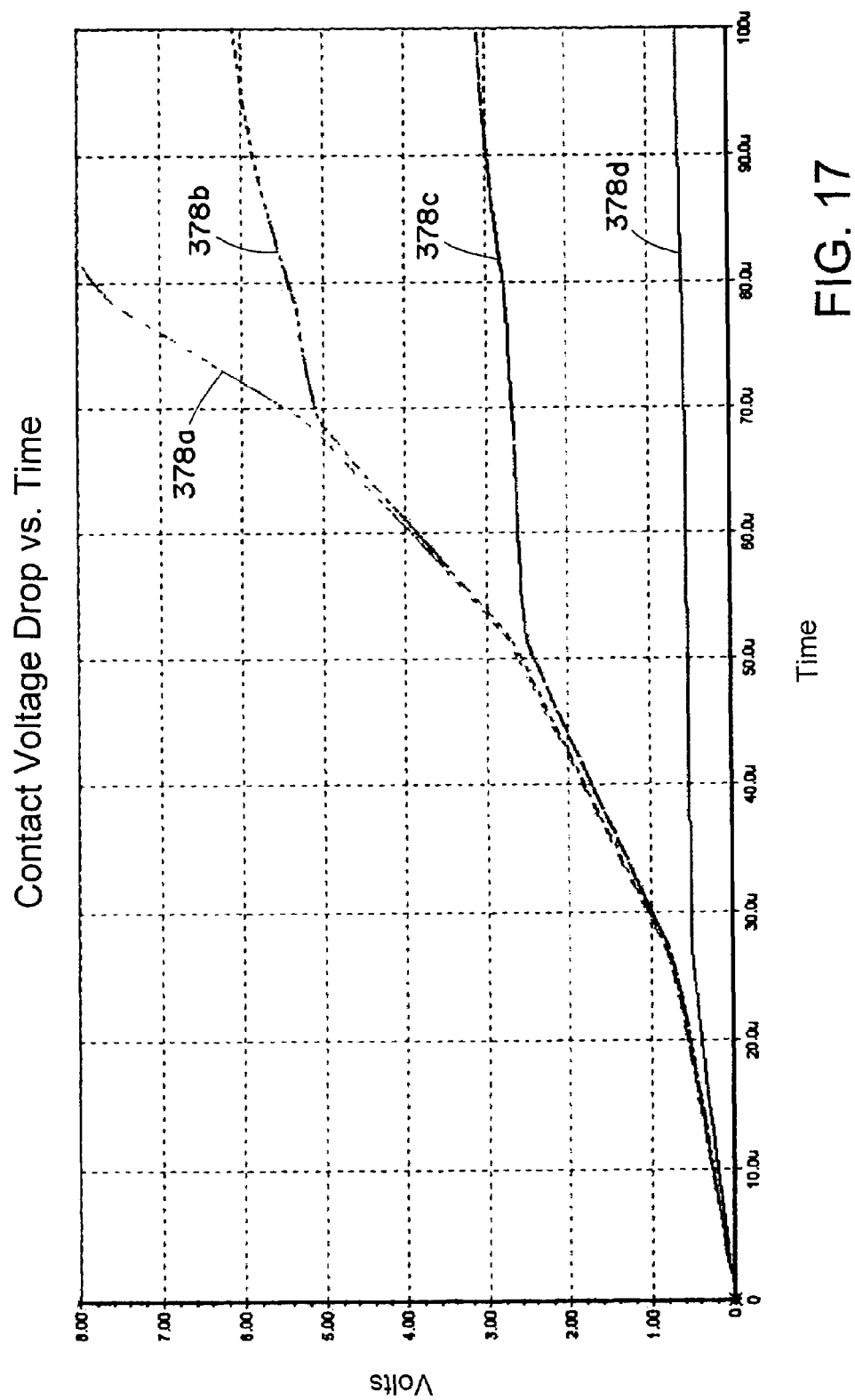
FIG. 17 is a graph showing contact voltage drop versus time for the simulation circuit of FIG. 13.

FIG. 17 is a graph showing the voltage across the contact resistances in volts versus time in microseconds, wherein curves 378a-378d correspond to voltage across probe resistors 370a-370d, respectively. It is noted that as each probe current limiter 366a-366d goes into current limit mode, the voltage across the corresponding contact resistance essentially stops rising and the voltage across the other (not in current limit mode) probe resistance rises faster.

The circuit utilized for current limiting has several advantages, including:
  it is open loop and therefore cannot go into oscillation or exhibit instability;
  it is relatively simple;
  it has low insertion loss since a voltage drop for a current sensing element (e.g. a shunt resistor) is not required;
  it allows all tests to be performed without affected the test results;
  it provides the opportunity to switch the current path on and off, which can be utilized in the measurement of contact resistance; and
  the current limit point is sharply defined and sufficiently stable for the purposes of probe protection (the pass device type may be selected to have zero tempco point on the gate transfer curve near the current where the device will be utilized).

Figure 18:
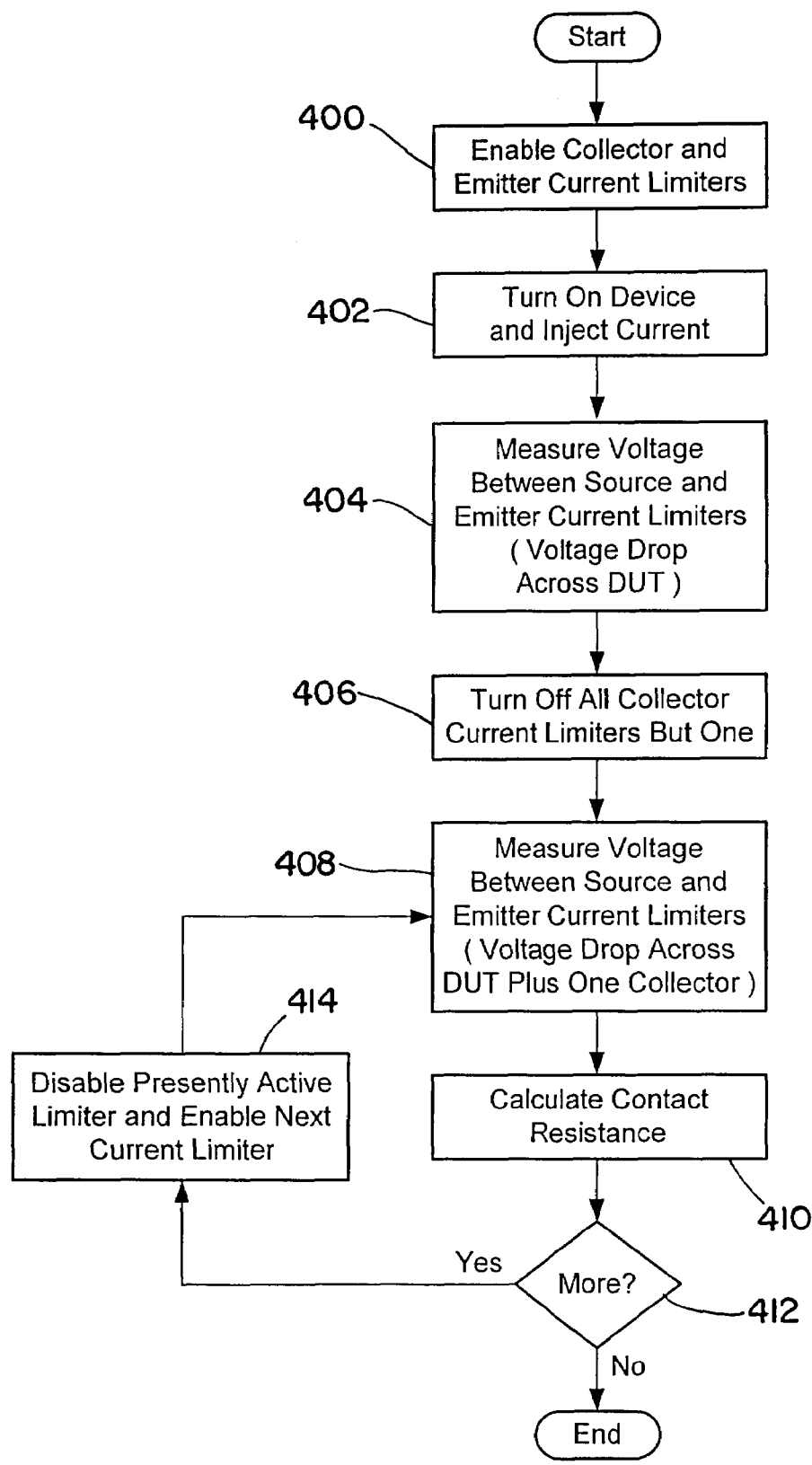
FIG. 18 is a flow diagram illustrating an exemplary method of determining contact resistance between probes and corresponding bonding pads in accordance with the invention.

Moving now to FIG. 18, illustrated are logical operations to implement an exemplary method of measuring contact resistance between probes 2 and bonding pads 3. The flow chart of FIG. 18 may be thought of as depicting steps of a method. Although FIG. 18 show a specific order of executing functional logic blocks, the order of executing the blocks may be changed relative to the order shown. Also, two or more blocks shown in succession may be executed concurrently or with partial concurrence. Certain blocks also may be omitted. In addition, any number of functions, logical operations, commands, state variables, semaphores or messages may be added to the logical flow for purposes of enhanced utility, accounting, performance, measurement, troubleshooting, and the like. It is understood that all such variations are within the scope of the present invention.

The logical flow may begin in block 400 wherein all collector and emitter circuits are enabled. For example, the analog switches 314 and 344 (FIGS. 11 and 12) are controlled via SOURCE OFF control line 315 and DRAIN OFF control line 345, respectively, such that the pass devices 316 and 346 have a bias voltage applied to their respective gates. Next at block 402, the DUT 4 (FIG. 7) is turned on, and a current is injected into the system via power supply 212 and current source 214. The injected current is a fixed current preferably in the range of about 500 mA to about 1 A.

At block 404, the voltage across the collector (drain) current limiters 5b and the emitter (source) current limiters 5a is measured. At this point, all the emitter current limiters 5a are in parallel, and all the collector current limiters 5b are in parallel (including the respective probes coupled to the current limiters). Thus, the effect of each individual probe's resistance essentially becomes negligible, and the actual voltage measurement is the inherent voltage drop across the DUT 4.

At block 406, all current limiters of a particular group (e.g., all collector current limiters 5b or all emitter current limiters 5a) except one are turned off. For example, when measuring the resistance of a single collector probe, the current limiter associated with that probe is enabled, as are all of the emitter current limiters. The remaining collector current limiters are disabled. Then at block 408, the voltage across the collector current limiters 5b and the emitter current limiters 5a is measured.

At block 408, the resistance for the probe is determined based on the fixed current and the inherent voltage drop across the DUT 4. For example, if the fixed current is 1 Amp, the first measured voltage is 0.7 Volts (i.e., the inherent voltage drop across the DUT), and the second measured voltage is 1 volt, then the resistance of the probe is 0.3 Ohms (e.g.,)

$$R = \frac{1V - 0.7V}{1 Amp}$$

At block 412, it determined if the measurement is to be performed for additional probes. If no additional measurements are to be taken, then the method ends. However, if more measurements are to be made, then at block 414 the currently enabled current limiter is disabled, and the next current limiter is enabled. Then the method moves back to block 408 and repeats.

Specific embodiments of the invention have been disclosed herein. One of ordinary skill in the art will readily recognize that the invention may have other applications in other environments. In fact, many embodiments and implementations are possible. The following claims are in no way intended to limit the scope of the present invention to the specific embodiments described above. In addition, any recitation of "means for" is intended to evoke a means-plus-function reading of an element and a claim, whereas, any elements that do not specifically use the recitation "means for", are not intended to be read as means-plus-function elements, even if the claim otherwise includes the word "means".

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

We claim:

1. A test apparatus for applying high current test stimuli to a semiconductor device in wafer or chip form, said semiconductor device including a plurality of contact points, comprising:

a plurality of probes for electrically coupling to respective ones of the plurality of contact points on the semiconductor device;

a plurality of current limiters electrically coupled to respective ones of the plurality of probes, said current limiters operative to limit current flow in a corresponding probe; and a current sensor electrically coupled to each of the plurality of probes, said current sensor operative to provide a signal when detected current in any probe exceeds a predetermined level.

2. The test apparatus of claim 1, further comprising an inhibit circuit operatively coupled to said current sensor, wherein when the current sensor generates the signal, the inhibit circuit prevents current flow through each of the probes.

3. The test apparatus of claim 1, wherein the semiconductor device is at least one of an integrated circuit or a power semiconductor.

4. The test apparatus of claim 1, wherein said current limiters comprise a power transistor in combination with control circuitry, said control circuitry operative to limit the current flow through the power transistor.

5. The test apparatus of claim 4, wherein said power transistor is a power metal oxide semiconductor field effect transistor (MOSFET) or an insulated gate bi-polar transistor (IGBT).

6. The test apparatus of claim 1, wherein said current sensor comprises a current limit sensing circuit operative to detect when any one of the current limiters transition into a constant current mode.

7. The test apparatus of claim 1, further comprising a silicon controlled rectifier (SCR) device coupled between an emitter/drain terminal and a collector/source terminal of the semiconductor device, wherein said current sensor comprises a current limit sensing circuit that drives the SCR device so as to shunt current away from the emitter/drain and collector/source of the semiconductor device.

8. The test apparatus of claim 1, further comprising a verification device operative to determine if a resistance between a probe/contact interface defined between a probe and a corresponding contact point is within predetermined limits.

9. The test apparatus of claim 8, wherein said verification device comprises measurement circuitry to sense a voltage drop across each individual probe/contact interface.

10. The test apparatus of claim 9, wherein said measurement circuitry is operative to inject a measurement current through each probe and to sense a resulting voltage drop across the probe/contact interface.

11. The test apparatus of claim 1, wherein each of the plurality of current limiters is operative to be enabled or disabled independent of other ones of the plurality of current limiters.

12. The test apparatus of claim 1, wherein the current limiters are configured as open loop controllers.

13. A method for applying high current test stimuli to a semiconductor device in wafer or chip form, said semiconductor device including a plurality of contact points, comprising:
coupling a plurality of probes to at least one of the plurality of contact points on the semiconductor device;
independently limiting current flow through each probe of the plurality of probes to a predetermined level; and
providing a signal when detected current in any probe exceeds a predetermined level.

14. The method of claim 13, further comprising inhibiting current flow through the probes upon detection of a fault condition.

15. The method of claim 13, further comprising determining if a resistance between a contact interface defined between a probe and a corresponding contact point is within predetermined limits.

16. The method of claim 15, wherein determining the resistance includes measuring a voltage drop across each individual contact interface.

17. The method of claim 16, wherein measuring a voltage drop includes injecting a measurement current through each probe and measuring the resulting voltage drop across the contact interface.

18. The method of claim 13, wherein independently limiting current includes using an open loop controller to limit the current.

19. The method of claim 13, further comprising generating a signal when the current flow in any probe of the plurality of probes exceeds the predetermined level.

20. The method of claim 19, further comprising inhibiting current flow through the plurality of probes upon generation of the signal.

21. The test apparatus according to claim 1, wherein the current limiters limit the current flow in each respective probe to a predetermined level.

22. The method according to claim 13, further comprising protecting the probes from an over-voltage condition based on a voltage drop across the current limiters.

23. A test apparatus for applying high current test stimuli to a semiconductor device in wafer or chip form, said semiconductor device including a plurality of contact points, comprising:
a plurality of probes for electrically coupling to at least one of the plurality of contact points on the semiconductor device;
a plurality of current limiters electrically coupled to respective ones of the plurality of probes, said current limiters operative to limit current flow in a corresponding probe;
a voltage protection circuit electrically coupled to said plurality of current limiters, said voltage protection circuit operative to protect the plurality of probes from an over-voltage condition; and
a trigger circuit electrically coupled to each of the plurality of current limiters and to the protection circuit, said trigger circuit operative to detect a voltage drop across the current limiters, and when the voltage drop across any current limiter exceeds a predetermined level, the trigger circuit is operative to command the voltage protection circuit to enter a protection mode.

24. The test apparatus according to claim 23, wherein said protection circuit comprises a silicon controlled rectifier (SCR) device coupled between an emitter/drain terminal and a collector/source terminal of the test apparatus, wherein said trigger circuit comprises a voltage sensing circuit that fires the SCR device so as to shunt current away from the emitter/drain and collector/source of the test apparatus.

* * * * *